United States Patent
Uhm et al.

(10) Patent No.: US 12,453,253 B2
(45) Date of Patent: Oct. 21, 2025

(54) ELECTRONIC DEVICE INCLUDING CAMERA MODULE

(71) Applicant: SAMSUNG ELECTRONICS CO., LTD., Suwon-si (KR)

(72) Inventors: Minsuk Uhm, Suwon-si (KR); Sungyoung Shin, Suwon-si (KR); Yilin Wu, Suwon-si (KR); Haechang Lee, Suwon-si (KR); Dongseop Lee, Suwon-si (KR); Kwangtai Kim, Suwon-si (KR); Donghyun Yeom, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 452 days.

(21) Appl. No.: 17/949,610

(22) Filed: Sep. 21, 2022

(65) Prior Publication Data
US 2023/0053234 A1    Feb. 16, 2023

Related U.S. Application Data

(63) Continuation of application No. PCT/KR2022/011677, filed on Aug. 5, 2022.

(30) Foreign Application Priority Data

Aug. 10, 2021    (KR) ............ 10-2021-0105344

(51) Int. Cl.
*H10K 59/123*    (2023.01)
*H10K 59/121*    (2023.01)
(Continued)

(52) U.S. Cl.
CPC ....... *H10K 59/123* (2023.02); *H10K 59/1213* (2023.02); *H10D 86/441* (2025.01); *H10D 86/60* (2025.01)

(58) Field of Classification Search
CPC .. H10K 59/123; H10K 59/1213; H10K 59/65; H10K 59/131; H10K 59/121; H10D 86/441; H10D 86/60
See application file for complete search history.

(56) References Cited

U.S. PATENT DOCUMENTS

| | | | |
|---|---|---|---|
| 11,968,865 B2 * | 4/2024 | Huang | G09G 3/3233 |
| 2007/0099318 A1 * | 5/2007 | Chang | G02F 1/133553 |
| | | | 438/22 |

(Continued)

FOREIGN PATENT DOCUMENTS

| | | |
|---|---|---|
| CN | 110232892 | 9/2019 |
| JP | 2014-164733 | 9/2014 |

(Continued)

OTHER PUBLICATIONS

Search Report and Written Opinion dated Nov. 15, 2022 in corresponding International Patent Application No. PCT/KR2022/011677.

(Continued)

*Primary Examiner* — Tan N Tran
(74) *Attorney, Agent, or Firm* — Nixon & Vanderhye, P.C.

(57) ABSTRACT

An example electronic device includes a camera module, wherein the electronic device may include a display panel and the camera module is disposed under the display panel. The display panel may include a first region having a first pixel density and overlapping the camera module, and a second region having a second pixel density greater than the first pixel density. The first region may include a transmissive region through which light is transmitted and which includes first pixels, and a non-transmissive region which is disposed around the transmissive region and in which a first driving circuit configured to drive the first pixels is arranged. Connection wires connecting the first pixels and the first (Continued)

driving circuit to each other may be arranged in the transmissive region, the connection wires may include at least one curved region.

16 Claims, 21 Drawing Sheets

(51) Int. Cl.
  *H10D 86/40* (2025.01)
  *H10D 86/60* (2025.01)

(56) References Cited

U.S. PATENT DOCUMENTS

| | | |
|---|---|---|
| 2019/0212788 A1 | 7/2019 | Kwak et al. |
| 2019/0252412 A1 | 8/2019 | An et al. |
| 2020/0113069 A1 | 4/2020 | Her et al. |
| 2020/0389575 A1 | 12/2020 | Gove |
| 2021/0351236 A1 | 11/2021 | Shin et al. |
| 2022/0210369 A1 | 6/2022 | Wan et al. |
| 2023/0103995 A1 | 4/2023 | Takahashi et al. |

FOREIGN PATENT DOCUMENTS

| | | |
|---|---|---|
| JP | 2017-146812 | 8/2017 |
| KR | 10-2019-0084397 | 7/2019 |
| KR | 10-2020-0039422 | 4/2020 |
| KR | 10-2021-0137856 | 11/2021 |
| KR | 10-2021-0141565 | 11/2021 |
| KR | 10-2550504 | 7/2023 |
| WO | 2020/247195 | 12/2020 |

OTHER PUBLICATIONS

Office Action dated Jun. 19, 2025 in Korean Patent Application No. 10-2021-0105344 and English-language translation.

\* cited by examiner

FIG. 17
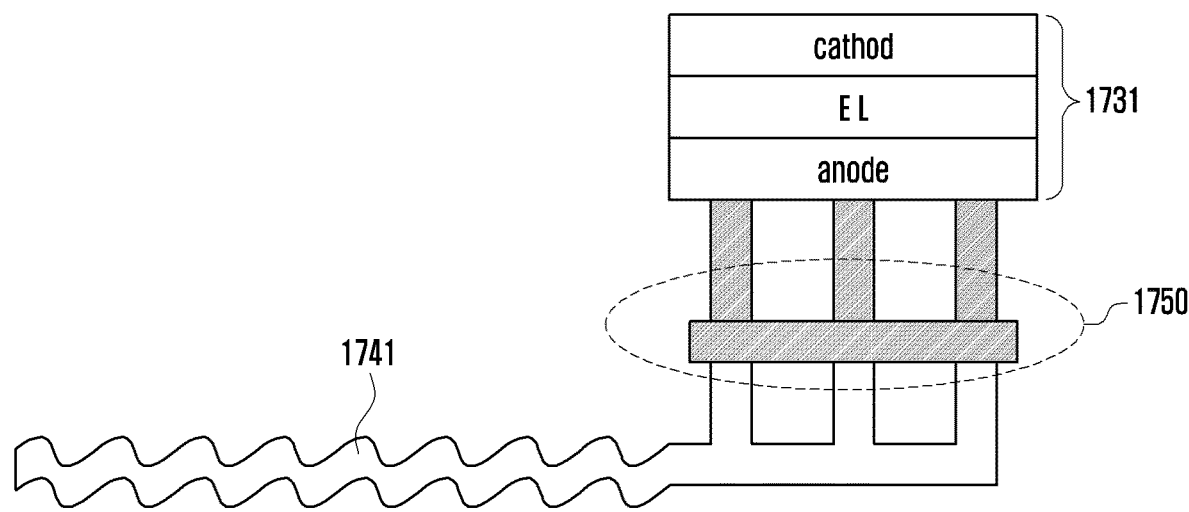
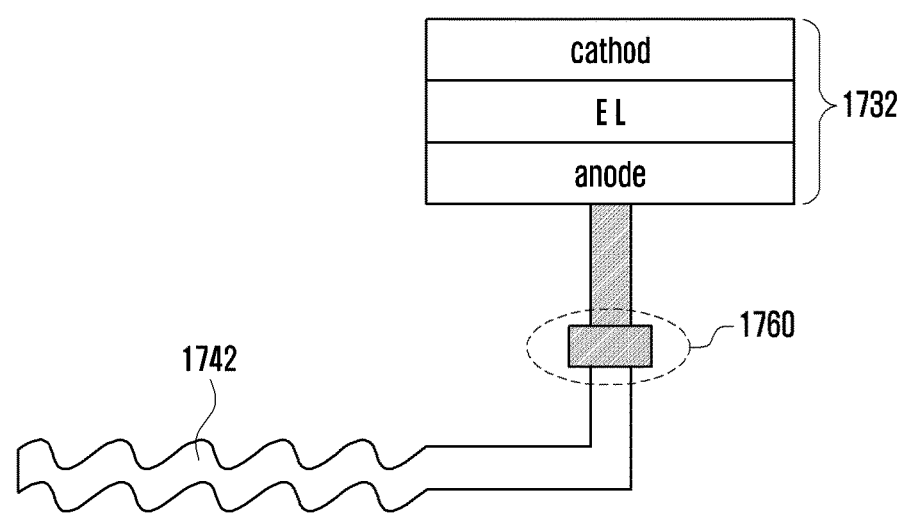

ELECTRONIC DEVICE INCLUDING CAMERA MODULE

CROSS-REFERENCE TO RELATED APPLICATIONS

This application is a continuation of International Application No. PCT/KR2022/011677 designating the United States, filed on Aug. 5, 2022, in the Korean Intellectual Property Receiving Office and claiming priority to Korean Patent Application No. 10-2021-0105344, filed on Aug. 10, 2021, in the Korean Intellectual Property Office, the disclosures of which are incorporated by reference herein in their entireties.

BACKGROUND

Field

Various embodiments of the disclosure relate to an electronic device including a camera module, and more particularly, to an electronic device including a camera module arranged on a rear surface of (e.g., under) a display.

Description of Related Art

Electronic devices (e.g., mobile electronic devices) are being released in various sizes according to functions and user preferences, and may include a large-screen touch display for securing wide visibility and convenience of operation. An electronic device may include at least one camera module (e.g., an image sensor). For example, the electronic device may include at least one camera module arranged around a display or through at least a portion of the display. Various techniques for increasing the amount of light incident on the camera module while arranging the camera module on the rear surface of (e.g., under) the display have been proposed.

SUMMARY

In an electronic device including an under-display camera (UDC), a camera module may be disposed below (e.g., under) a first region of a display (e.g., an under-display camera region). The display may include a transmissive region including a first region (e.g., an under-display camera region) and a non-transmissive region disposed around the transmissive region, and the camera module may be arranged to correspond to an angle of view of the transmissive region. In order to increase the light transmittance of the transmissive region, connection wires formed of a transparent material (e.g., transparent wires) may be arranged. Pixels arranged in the transmissive region and a driving circuit arranged in the non-transmissive region may be electrically connected to each other via the connection wires (e.g., transparent wires). Light spreading and flare may occur in the transmissive region due to a difference in refractive index between the connection wires (e.g., transparent wires) and an insulating film. The image quality of a captured image of the camera module may be deteriorated due to light spreading and flare caused by connection wires (e.g., transparent wires). Various embodiments of the disclosure include a camera module that is capable of suppressing light spreading and flare by changing a shape and an arrangement form of connection wires (e.g., transparent wires) arranged in a transmissive region of a first region of a display (e.g., an under-display camera region). The technical problems to be addressed by this disclosure are not limited to those described above, and other technical problems, which are not described above, may be clearly understood by a person ordinarily skilled in the related art to which this disclosure belongs.

An electronic device of the disclosure may include a display panel and a camera module disposed under the display module. The display panel may include a first region having a first pixel density and overlapping the camera module, and a second region having a second pixel density greater than the first pixel density. The first region may include a transmissive region through which light is transmitted and which includes first pixels, and a non-transmissive region which is disposed around the transmissive region and in which a first driving circuit configured to drive the first pixels is disposed. Connection wires connecting the first pixels and the first driving circuit to each other may be arranged in the transmissive region and the connection wires may include at least one curved region.

With an electronic device including a camera module according to various embodiments of the disclosure, it is possible to reduce or suppress light spreading and flare by changing a shape and an arrangement form of connection wires (e.g., transparent wires) arranged in a transmissive region of a first region of a display (e.g., an under-display camera region).

In addition, various effects directly or indirectly identified through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 17 is a view illustrating example contact portions according to the lengths of connection wires arranged in a transmissive region of a first region of a display (e.g., an under-display camera region).

DETAILED DESCRIPTION

Figure 1:
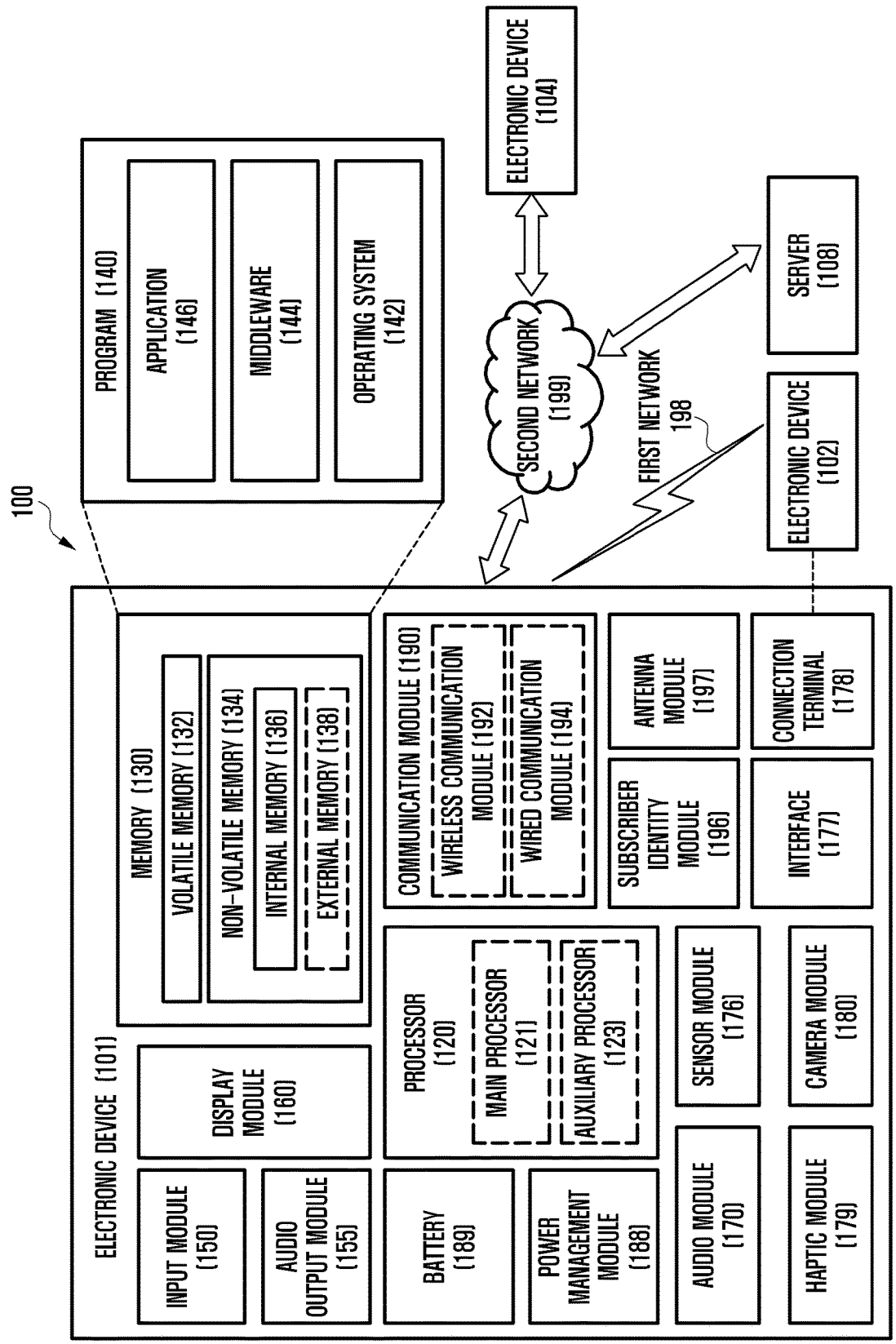
FIG. 1 is a block diagram illustrating an example electronic device according to various embodiments of the disclosure within a network environment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In various embodiments, at least one of the components (e.g., the connection terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, a display module 160 illustrated in FIG. 1 may include a flexible display configured such that a screen (e.g., a display screen) is foldable and/or unfoldable.

According to an embodiment, the display module 160 illustrated in FIG. 1 may include a flexible display that is slidably arranged to provide a screen (e.g., a display screen).

According to an embodiment, the display module 160 illustrated in FIG. 1 may include a foldable display or a flexible display, but the disclosure is not limited thereto. The display module 160 may include a bar-type display or a plate-type display.

Figure 2A:
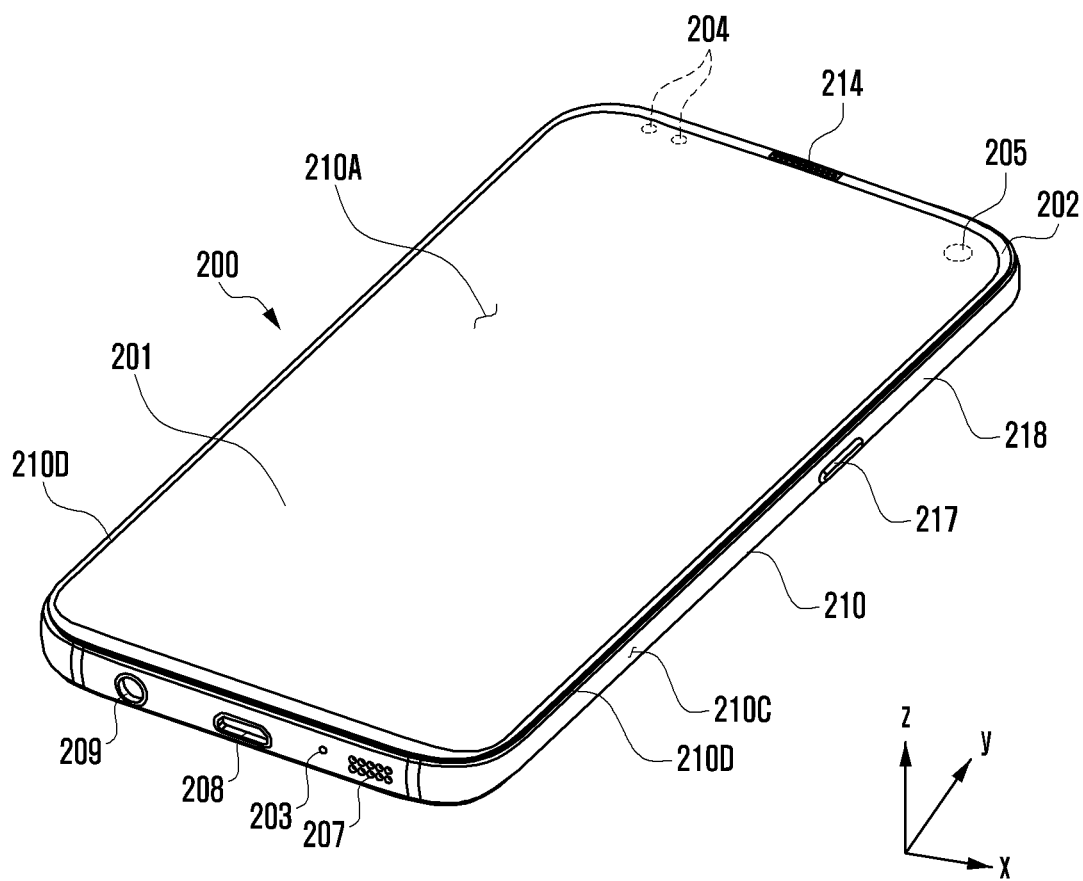
FIG. 2A is a front perspective view illustrating an example electronic device according to various embodiments of the disclosure.
Figure 2B:
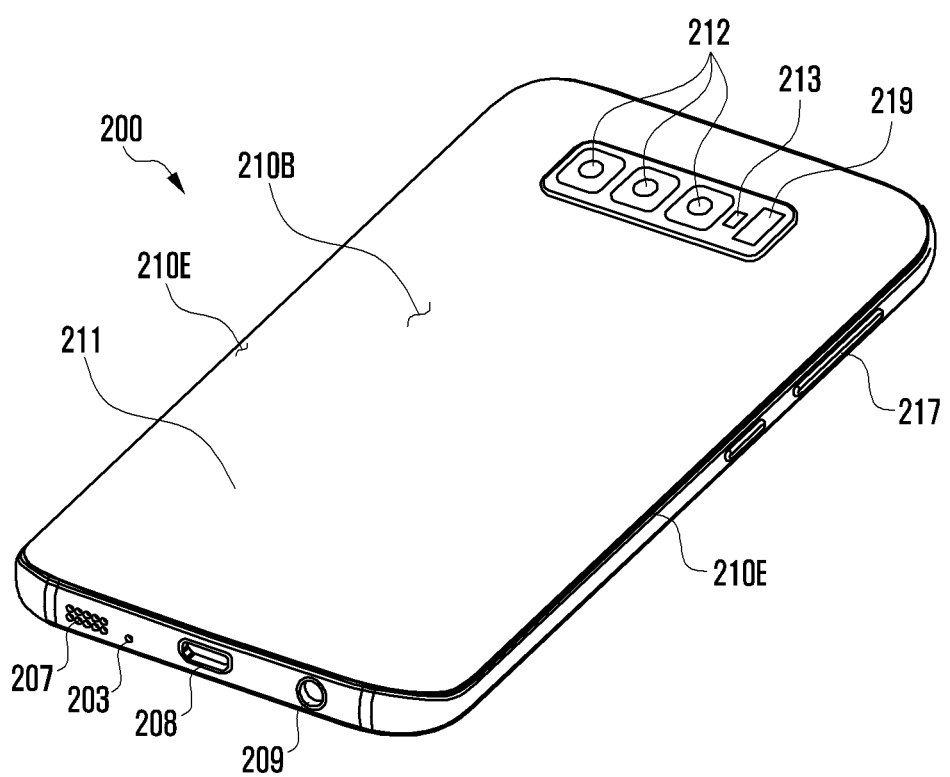
FIG. 2B is a rear perspective view illustrating the example electronic device according to various embodiments of the disclosure.

FIG. 2A is a front perspective view illustrating an example electronic device according to various embodiments of the disclosure. FIG. 2B is a rear perspective view illustrating the example electronic device according to various embodiments of the disclosure.

Referring to FIGS. 2A and 2B, an electronic device 200 (e.g., the electronic device 101 in FIG. 1) according to various embodiments of the disclosure may include a first surface (or a front surface) 210A and a second surface (or a rear surface) 210B, and a housing 210. A display 201 (e.g., the display module 160 in FIG. 1) may be arranged in a space defined by the housing 210. The housing 210 may include a side surface 210C surrounding the space between the first surface 210A and the second surface 210B. In an embodiment, the term "housing 210" may, for example, refer to a structure providing a part of the first surface 210A, the second surface 210B, and the side surface 210C.

According to an embodiment, at least a portion of the first surface 210A may be defined by a substantially transparent front plate 202 (e.g., a glass plate or a polymer plate including various coating layers).

According to an embodiment, the second surface 210B may be defined by a substantially opaque rear plate 211. The rear plate 211 may be include, for example, coated or colored glass, ceramic, polymer, metal (e.g., aluminum, stainless steel (STS), or magnesium), or a combination of two or more of these materials. However, the disclosure is not limited thereto, and the rear plate 211 may be formed of transparent glass.

According to an embodiment, the side surface 210C may be defined by a side bezel structure (or a "side member") 218 coupled to the front plate 202 and the rear plate 211 and including metal and/or polymer. In some embodiments, the rear plate 211 and the side bezel structure 218 may be integrally configured, and may include the same material (e.g., a metal material such as aluminum).

As an embodiment, the front plate 202 may include two first regions 210D, which are bent from the first surface 210A toward the rear plate 211 and extend seamlessly. The two first regions 210D may be disposed at opposite long edge ends of the front plate 202.

As an embodiment, the rear plate 211 may include two second regions 210E, which are bent from the second surface 210B toward the front plate 202 and extend seamlessly.

In various embodiments, the front plate 202 (or the rear plate 211) may include only one of the first regions 210D (or the second regions 210E). In various embodiments, some of the first regions 210D or the second regions 210E may not be included. In various embodiments, when viewed from a side of the electronic device 200, the side bezel structure 218 may have a first thickness (or width) at the side at which the first regions 210D or the second regions 210E are not included, and may have a second thickness (or width), which is smaller than the first thickness at the side at which the first regions 210D or the second regions 210E are included.

According to an embodiment, the electronic device 200 may include at least one of a display 201 (e.g., the display module 160 in FIG. 1), a sound input device 203 (e.g., the input module 150 in FIG. 1), sound output devices 207 and 214 (e.g., the sound output module 155 in FIG. 1), sensor modules 204 and 219 (e.g., the sensor module 176 in FIG. 1), camera modules 205 and 212 (e.g., the camera module 180 in FIG. 1), a flash 213, a key input device 217, an indicator (not illustrated), and connectors 208 and 209. In some embodiments, in the electronic device 200, at least one of the components (e.g., the key input device 217) may be omitted, or other components may be additionally included.

According to an embodiment, the display 201 (e.g., the display module 160 in FIG. 1) may be visually visible through an upper end portion of the front plate 202. In some embodiments, at least a portion of the display 201 may be visible through the front plate 202 defining the first surface 210A and the first regions 210D of the side surface 210C. The display 201 may be coupled to or arranged adjacent to a touch-sensitive circuit, a pressure sensor capable of measuring touch intensity (pressure), and/or a digitizer configured to detect a magnetic field-type stylus pen. In some embodiments, at least some of the sensor modules 204 and 219 and/or at least some of the key input devices 217 may be arranged in the first regions 210D and/or the second regions 210E.

In some embodiments, at least one of a sensor module 204, a camera module 205 (e.g., an image sensor), an audio module 214, and a fingerprint sensor may be included on the rear surface of the screen display region of the display 201.

According to some embodiments, the display 201 may be coupled to or arranged adjacent to a touch-sensitive circuit, a pressure sensor capable of measuring the intensity of a touch (pressure), and/or a digitizer that detects a magnetic-field-type stylus pen.

In some embodiments, at least some of the sensor modules 204 and 219 and/or at least some of the key input devices 217 may be arranged in the first regions 210D and/or the second regions 210E.

According to an embodiment, the sound input device 203 may include a microphone. In various embodiments, the sound input device 203 may include a plurality of microphones arranged to sense the direction of sound. The sound output devices 207 and 214 may include sound output devices 207 and 214. The sound output devices 207 and 214 may include an external speaker 207 and a receiver for a call (e.g., the audio module 214). According to various embodiments, the sound input device 203 (e.g., a microphone), the sound output devices 207 and 214, and the connectors 208 and 209 are arranged in the inner space in the electronic device 200, and may be exposed to the external environment through one or more holes or openings provided in the housing 210. According to some embodiments, the holes provided in the housing 210 may be commonly used for the sound input device 203 (e.g., a microphone) and the sound output devices 207 and 214. According to various embodiments, the sound output devices 207 and 214 may include a speaker that operates without a separate speaker hole provided in the housing 210 (e.g., a piezo speaker).

According to an embodiment, the sensor modules 204 and 219 (e.g., the sensor module 176 in FIG. 1) may generate an electrical signal or a data value corresponding to the internal operating state or the external environmental state of the electronic device 200. The sensor modules 204 and 219 may include, for example, a first sensor module 204 (e.g., a proximity sensor) arranged on the first surface 210A of the housing 210, a second sensor module 219 (e.g., a heart rate monitor (HRM) sensor) arranged on the second surface 210B of the housing 210, and/or a third sensor module (not illustrated) (e.g., a fingerprint sensor). For example, the fingerprint sensor may be arranged on the first surface 210A (e.g., the display 201) and/or the second surface 210B of the housing 210. The electronic device 200 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 205 and 212 may include a first camera module 205 arranged on the first surface 210A of the electronic device 200, and a second camera module 212 arranged on the second surface 210B of the electronic device 200. A flash 213 may be disposed around or in the vicinity of the camera modules 205 and 212. The camera modules 205 and 212 may include one or more lenses, an image sensor, and/or an image signal processor. The flash 213 may include, for example, a light-emitting diode (LED) or a xenon lamp.

As an embodiment, the first camera module 205 may be arranged under the display panel of the display 201 in a manner of an under-display camera (UDC). In some embodiments, two or more lenses (a wide-angle lens and a telephoto lens) and image sensors may be arranged on one surface of the electronic device 200. In some embodiments, a plurality of first camera modules 205 may be arranged on the first surface of the electronic device 200 (e.g., the surface on which a screen is to be displayed) in an under-display camera (UDC) manner As an embodiment, the key input devices 217 may be arranged on the side surface 210C of the housing 210. In another embodiment, the electronic device 200 may not include some or all of the above-mentioned key input devices 217, and a key input device 217, which is not included in the electronic device 101, may be implemented in another form, such as a soft key, on the display 201. In various embodiments, a key input device 217 may be implemented using a pressure sensor included in the display 201.

As an embodiment, the connectors 208 and 209 may include a first connector hole 208, which is capable of accommodating a connector (e.g., a USB connector) for transmitting/receiving power and/or data to/from an external electronic device, and/or a second connector hole 209 (or an earphone jack), which is capable of accommodating a connector for transmitting/receiving an audio signal to/from an external electronic device. The first connector hole 208 may include a universal serial bus (USB) A type or a USB C type port. When the first connector hole 208 supports the USB C type, the electronic device 200 (e.g., the electronic device 101 in FIG. 1) may support USB power delivery (PD) charging.

As an embodiment, some cameras 205 of the camera modules 205 and 212 and/or some sensor modules 204 of the sensor modules 204 and 219 may be arranged to be visually visible through the display 201. As another example, when the camera module 205 is arranged in an under-display camera (UDC) manner, the camera module 205 may not be visually visible to the outside.

As an embodiment, the camera module 205 may be arranged to overlap the display region, and a screen may also be displayed on the display region corresponding to the camera module 205. Some sensor modules 204 may be disposed in the internal space in the electronic device so as to perform the functions thereof without being visually exposed through the front plate 202.

Figure 3A:
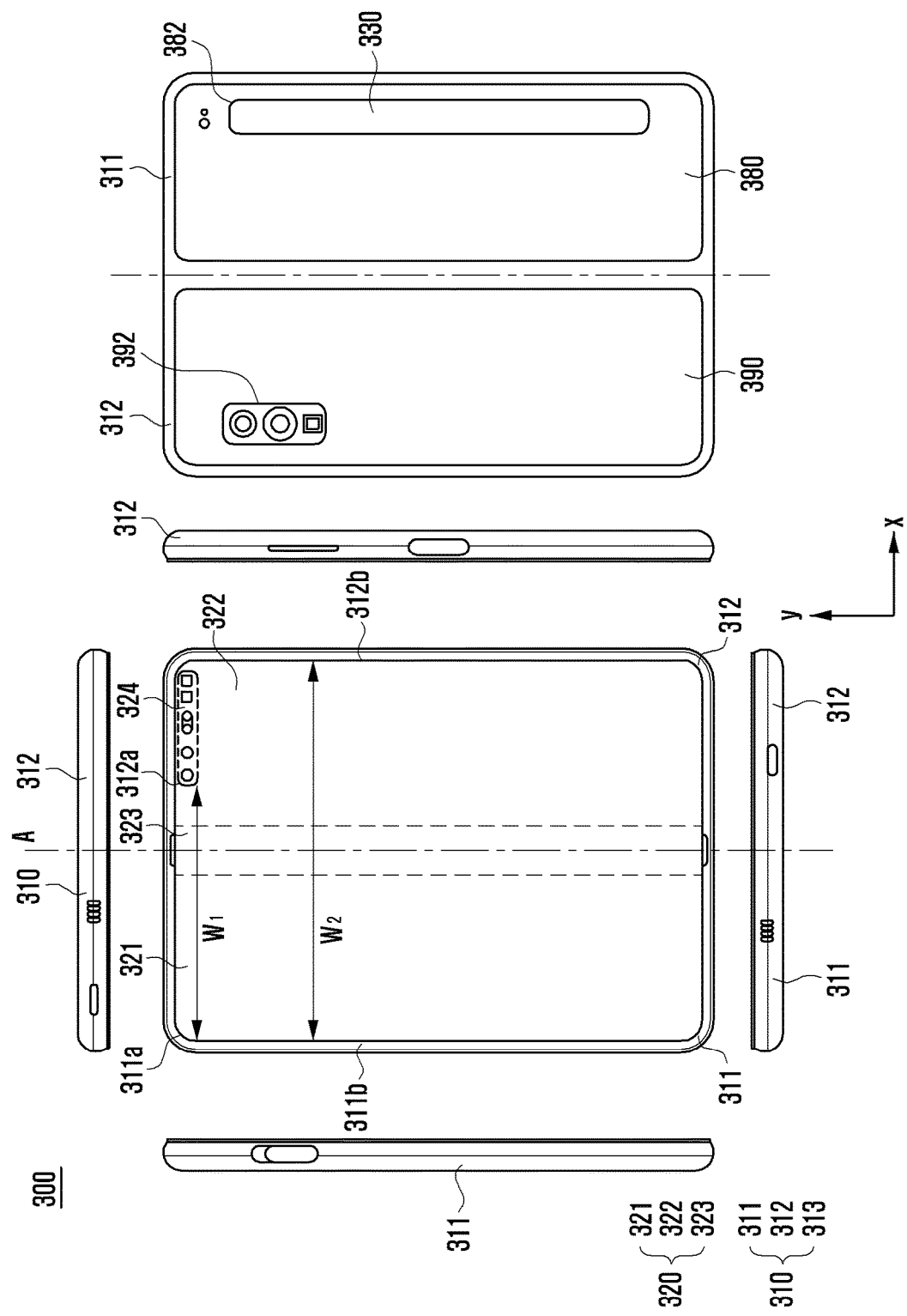
FIG. 3A is a view illustrating an unfolded (e.g., opened) state of an example electronic device according to various embodiments of the disclosure.
Figure 3B:
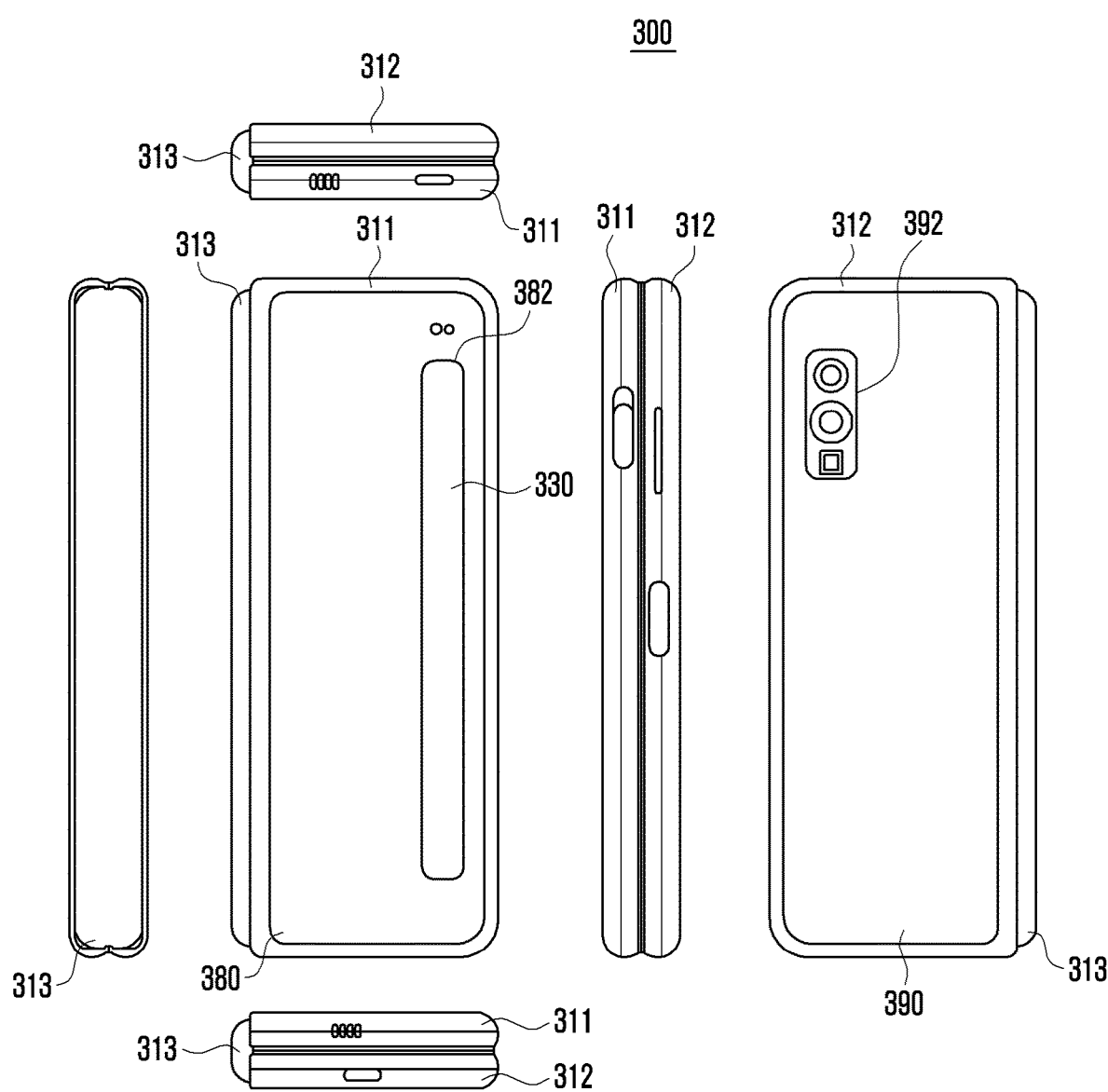
FIG. 3B is a view illustrating a folded (e.g., closed) state of the example electronic device according to various embodiments of the disclosure.

FIG. 3A is a view illustrating an unfolded (e.g., opened) state of an example electronic device according to various embodiments of the disclosure. FIG. 3B is a view illustrating a folded (e.g., closed) state of the example electronic device according to various embodiments of the disclosure.

Referring to FIGS. 3A and 3B, an electronic device 300 (e.g., the electronic device 101 in FIG. 1) may include a housing 310 and a display 320 arranged in a space defined by the housing 310. As an embodiment, the display 320 may include a flexible display or a foldable display. The surface on which the display 320 is arranged may be defined as a first surface or a front surface of the electronic device 300 (e.g., a surface on which a screen is to be displayed when unfolded). In addition, the surface opposite to the front surface may be defined as a second surface or a rear surface of the electronic device 300. In addition, the surface surrounding the space between the front surface and the rear surface may be defined as a third surface or a side surface of the electronic device 300. For example, in the electronic device 300, the folding region 323 may be folded or unfolded in a first direction (e.g., the x-axis direction) with reference to a folding axis (e.g., an axis A).

As an embodiment, the housing 310 may include a first housing structure 311, a second housing structure 312 including a sensor region 324, a first rear cover 380, and a second rear cover 390. The housing 310 of the electronic device 300 is not limited to the shape and assembly illustrated in FIGS. 3A and 3B, and may be implemented by a combination and/or an assembly of different shapes or components. For example, in an embodiment, the first housing structure 311 and the first rear cover 380 may be integrated with each other, and the second housing structure 312 and the second rear cover 390 may be integrated with each other.

As an embodiment, the first housing structure 311 and the second housing structure 312 may be arranged on opposite sides about the folding axis A, and may have generally symmetrical shapes with respect to the folding axis A. The angle or distance formed between the first housing structure 311 and the second housing structure 312 may vary depending on whether the electronic device 300 is in an unfolded state (e.g., a first state), a folded state (e.g., a second state), or an intermediate state (e.g., a third state).

As an embodiment, unlike the first housing structure 311, the second housing structure 312 may additionally include the sensor region 324 in which various sensors (e.g., an illuminance sensor, an iris sensor, and/or an image sensor) are arranged, but the first and second structures may have mutually symmetrical shapes in other regions.

As an embodiment, at least one sensor (e.g., a camera module, an illuminance sensor, an iris sensor, and/or an image sensor) may be arranged not only in the sensor region 324, but also below the display and/or in bezel region.

As an embodiment, the first housing structure 311 and the second housing structure 312 may define together a recess that accommodates the display 320. In the illustrated embodiment, due to the sensor region 324, the recess may have two or more different widths in a direction (e.g., in an x-axis direction) perpendicular to the folding axis A.

For example, the recess may have a first width W1 between a first portion 311a of the first housing structure 311 and a first portion 312a of the second housing structure 312 that is provided at an edge of the sensor region 324 of the second housing structure 312. The recess may have a second width W2 formed by a second portion 311b of the first housing structure 311 that is parallel to the folding axis A in the first housing structure 311 and a second portion 312b of the second housing structure 312 that does not correspond to the sensor region 324 in the second housing structure 312 and is parallel to the folding axis A. In this case, the second width W2 may be greater than the first width W1. In other words, the first portion 311a of the first housing structure 311 and the first portion 312a of the second housing structure 312, which have mutually asymmetric shapes, may form the first width W1 of the recess. The second portion 311b of the first housing structure 311 and the second portion 312b of the second housing structure 312, which have mutually symmetrical shapes, may form the second width W2 of the recess.

As an embodiment, the distance from the folding axis A to the first portion 312a of the second housing structure 312 and the distance from the folding axis A to the second portion 312b of the second housing structure 312 may be different from each other. The widths of the recess are not limited to the illustrated example. In various embodiments, the recess may have multiple widths due to the shape of the sensor region 324 or due to the asymmetric portions of the first housing structure 311 and the second housing structure 312.

As an embodiment, at least a portion of the first housing structure 311 and at least a portion of the second housing structure 312 may be formed of a metal material or a non-metal material having rigidity of a level selected in order to support the display 320.

As an embodiment, the sensor region 324 may have a predetermined region adjacent to one corner of the second housing structure 312. However, the arrangement, shape, and size of the sensor region 324 are not limited to the illustrated example. For example, in an embodiment, the sensor region 324 may be provided at another corner of the second housing structure 312 or in any region between the upper and lower end corners.

As an embodiment, components embedded in the electronic device 300 to perform various functions may be exposed to the front surface of the electronic device 300 through the sensor region 324 or one or more openings provided in the sensor region 324. In various embodiments, the components may include various types of sensors. The sensor may include, for example, at least one of an illuminance sensor, a front camera (e.g., a camera module), a receiver, or a proximity sensor.

The first rear cover 380 may be disposed on one side of the folding axis A on the rear surface of the electronic device 300, and may have, for example, a substantially rectangular periphery, which may be surrounded by the first housing structure 311. Similarly, the second rear cover 390 may be disposed on the other side of the folding axis A on the rear surface of the electronic device 300, and the periphery of the second rear cover 390 may be surrounded by the second housing structure 312.

In the illustrated embodiment, the first rear cover 380 and the second rear cover 390 may have substantially symmetrical shapes about the folding axis A. However, the first rear cover 380 and the second rear cover 390 do not necessarily have mutually symmetrical shapes. In an embodiment, the electronic device 300 may include a first rear cover 380 and a second rear cover 390 having various shapes. In an embodiment, the first rear cover 380 may be integrated with the first housing structure 311, and the second rear cover 390 may be integrated with the second housing structure 312.

As an embodiment, the first rear cover 380, the second rear cover 390, the first housing structure 311, and the second housing structure 312 may define a space in which various components (e.g., a printed circuit board or a battery) of the electronic device 300 may be arranged. As an embodiment, one or more components may be arranged or visually exposed on the rear surface of the electronic device 300. For example, at least a portion of a sub-display 330 may be visually exposed through a first rear region 382 of the first rear cover 380. In another embodiment, one or more components or sensors may be visually exposed through a second rear region 392 of the second rear cover 390. In various embodiments, the sensors may include an illuminance sensor, a proximity sensor, and/or a rear camera.

As an embodiment, the hinge cover 313 may be arranged between the first housing structure 311 and the second housing structure 312 and configured to cover an internal component (e.g., the hinge structure). The hinge cover 313 may cover a portion in which the first housing structure 311 and the second housing structure 312 are brought into contact with each other by unfolding and folding the electronic device 300.

As an embodiment, the hinge cover 313 may be covered by a portion of the first housing structure 311 and a portion of the second housing structure 312 or exposed to the outside depending on whether the electronic device 300 is in the unfolded state (flat state) or in the folded state. As an embodiment, when the electronic device 300 is in the unfolded state, the hinge cover 313 may not be exposed by being covered by the first housing structure 311 and the second housing structure 312. As an embodiment, when the electronic device 300 is in the folded state (e.g., the fully folded state), the hinge cover 313 may be exposed to the outside between the first housing structure 311 and the second housing structure 312. As an embodiment, when the first housing structure 311 and the second housing structure 312 are in the intermediate state in which the first housing structure 311 and the second housing structure 312 are folded with a certain angle therebetween, the hinge cover 313 may be partially exposed to the outside between the first housing structure 311 and the second housing structure 312. However, the region exposed in this case may be smaller than that in the fully folded state. As an embodiment, the hinge cover 313 may include a curved surface.

The display 320 may be disposed in a space defined by the housing 310. For example, the display 320 may be seated in the recess defined by the housing 310, and may include most of the front surface of the electronic device 300.

Accordingly, the front surface of the electronic device 300 may include the display 320, and a partial region of the first housing structure 311 and a partial region of the second housing structure 312, which are adjacent to the display 320. In addition, the rear surface of the electronic device 300 may include the first rear cover 380, a partial region of the first housing structure 311 adjacent to the first rear cover 380, the second rear cover 390, and a partial region of the second housing structure 312 adjacent to the second rear cover 390.

The display 320 may be a display in which at least a partial region is deformable into a planar surface or a curved surface. As an embodiment, the display 320 may include a folding region 323, a first region 321 arranged on one side (e.g., the left side in FIG. 3A), and a second region arranged on the other side (the right side in FIG. 3A) with reference to the folding region 323.

As an embodiment, the display 320 may include a top emission or bottom emission-type OLED display. The OLED display may include a low-temperature color filter (LTCF) layer, window glass (e.g., an ultra-thin glass (UTG) or polymer window) and an optical compensation film (OCF). Here, a polarizing film (or a polarizing layer) may be replaced with the LTCF layer of the OLED display.

The regions into which the display 320 is divided in FIGS. 3A and 3B is merely illustrative, and the display 320 may be divided into multiple regions (e.g., two or more regions) depending on the structure or functions thereof. As an embodiment, the region of the display 320 may be divided by the folding region 323 or the folding axis A extending parallel to the y axis. However, in another embodiment, the region of the display 320 may be divided with reference to another folding region (e.g., a folding region parallel to the x axis) or another folding axis (e.g., a folding axis parallel to the x axis).

As an embodiment, the first region 321 and the second region 322 may have generally symmetrical shapes about the folding region 323.

Hereinafter, the operations of the first housing structure 311 and the second housing structure 312 and respective regions of the display 320 according to the states of the electronic device 300 (e.g., the unfolded state (flat state) and the folded state) will be described.

As an embodiment, when the electronic device 300 is in the unfolded state (flat state) (e.g., FIG. 3A), the first housing structure 311 and the second housing structure 312 may be arranged to form an angle of about 180 degrees therebetween and to be oriented in the same direction. The surface of the first region 321 and the surface of the second region 322 of the display 320 may be disposed at about 180 degrees relative to each other and may be oriented in substantially the same direction (e.g., the front direction of the electronic device). The folding region 323 may be disposed in substantially the same plane as the first region 321 and the second region 322.

As an embodiment, when the electronic device 300 is in the folded state (e.g., FIG. 3B), the first housing structure 311 and the second housing structure 312 may be arranged to face each other. The surface of the first region 321 and the surface of the second region 322 of the display 320 may face each other while forming a narrow angle (e.g., an angle between 0 and about 10 degrees) relative to each other. At least a portion of the folding region 323 may be formed as a curved surface having, for example, a predetermined curvature.

As an embodiment, when the electronic device 300 is in the intermediate state (a half-folded state), the first housing structure 311 and the second housing structure 312 may be arranged to have a certain angle relative to each other. The surface of the first region 321 and the surface of the second region 322 of the display 320 may form an angle greater than that in the folded state and smaller than that in the unfolded state. At least a portion of the folding region 323 may have a curved surface having, for example, a predetermined curvature, and the curvature at this time may be smaller than the curvature in the folded state.

An electronic device according to various embodiments of the disclosure may include electronic devices such as a bar type, a foldable type, a rollable type, a sliding type, or a wearable type electronic device, a tablet PC, and/or a notebook PC. The electronic device 101, 200, or 300 according to various embodiments of the disclosure is not limited to the above-described examples, and may include various other electronic devices.

Figure 4:
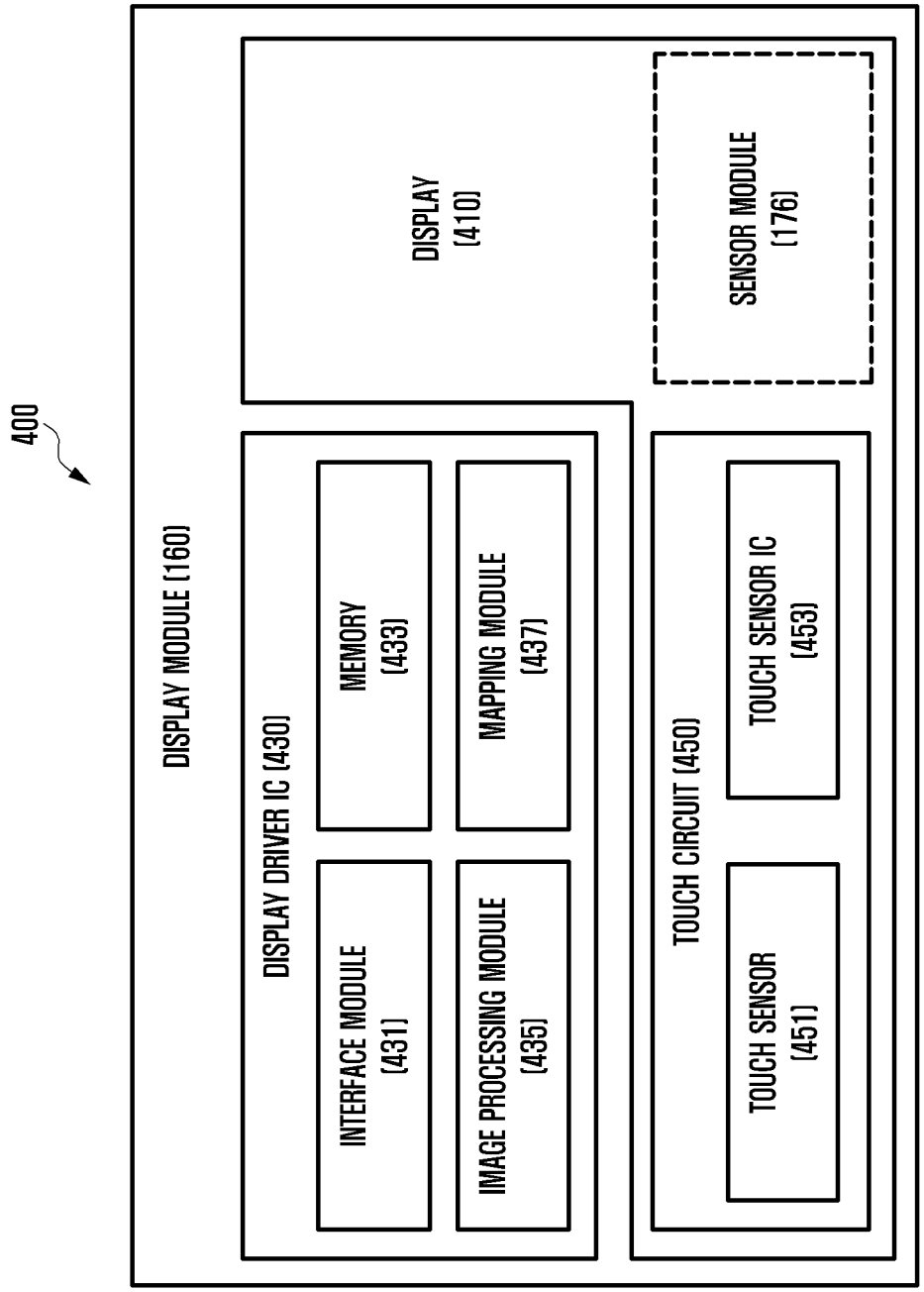
FIG. 4 is a block diagram of a display module of an example electronic device according to various embodiments.

FIG. 4 is a block diagram of a display module 160 of an example electronic device 400 according to various embodiments.

Referring to FIG. 4, the display module 160 may include a display 410 (e.g., the display 201 in FIG. 2A or the display 320 in FIG. 3A), and a display driver integrated circuit (IC) 430 (hereinafter, referred to as "DDI 430") configured to control the display 410.

The DDI 430 may include an interface module 431, a memory 433 (e.g., a buffer memory), an image processing module 435, and/or a mapping module 437.

According to an embodiment, the DDI 430 may receive image data or image information including an image control signal corresponding to a command for controlling the image data from another component of the electronic device 400 (e.g., the electronic device 101 in FIG. 1, the electronic device 200 in FIG. 2A, or the electronic device 300 in FIG. 3A) via the interface module 431.

According to an embodiment, the image information may be received from a processor (e.g., the processor 120 in FIG. 1) (e.g., the main processor 121 in FIG. 1)) (e.g., an application processor), or an auxiliary processor (e.g., the auxiliary processor 123 in FIG. 1) (e.g., a graphics processing device) operated independently from the function of the main processor 121.

According to an embodiment, the DDI 430 may communicate with a touch circuit 450 or a sensor module 176 (e.g., the camera module 205 in FIG. 2A and/or a camera module arranged in the sensor region 324 in FIG. 3A) via the interface module 431. In addition, the DDI 430 may store at least a part of the received image information in the memory 433. As an example, the DDI 430 may store at least a part of the received image information in the memory 433 in units of frames.

According to an embodiment, the image processing module 435 may perform pre-processing or post-processing (e.g., adjustment of resolution, brightness, or size) on at least a part of the image data based at least on characteristics of the image (e.g., video) data or the characteristics of the display 410.

According to an embodiment, the mapping module 437 may generate a voltage value or a current value corresponding to the image data pre-processed or post-processed via the image processing module 435. As an embodiment, the generation of the voltage value or the current value may be performed based at least partially on, for example, the attributes of the pixels of the display 410 (e.g., the array of pixels (an RGB stripe or pentile structure), the size of each of sub-pixels, or amount of use or deterioration of pixels).

As an embodiment, at least some of the pixels of the display 410 are driven based at least partially on the voltage value or the current value, so that visual information (e.g., text, images, or icons) corresponding to the image (e.g., video) data can be displayed through the display 410.

According to an embodiment, the display module 160 may further include a touch circuit 450. The touch circuit 450 may include a touch sensor 451 and a touch sensor IC 453 configured to control the touch sensor 251.

As an embodiment, the touch sensor IC 453 may control the touch sensor 451 to detect a touch input or a hovering input with respect to a specific position in the display 410. For example, the touch sensor IC 453 may detect a touch input or a hovering input by measuring a change in a signal (e.g., voltage, light amount, resistance, or charge amount) with respect to a specific position in the display 410. The touch sensor IC 453 may provide a processor (e.g., the processor 120 in FIG. 1) with information about the detected touch input or hovering input (e.g., position, are, pressure, or time).

According to an embodiment, at least a part of the touch circuit 450 (e.g., the touch sensor IC 453) may be included as a part of the DDI 430 or the display 410.

According to an embodiment, at least a part of the touch circuit 450 (e.g., the touch sensor IC 453) may be included as a part of another component (e.g., the auxiliary processor 123) disposed outside the display module 160.

According to an embodiment, the display module 160 may further include a sensor module 176 and/or a control circuit for the sensor module 176. The sensor module 176 may include at least one sensor (e.g., a camera module, an illumination sensor, a fingerprint sensor, an iris sensor, a pressure sensor, and/or an image sensor). In this case, the at least one sensor or a control circuitry for the same may be embedded in a part of the display module 160 (e.g., the display 410 or the DDI 430) or a part of touch circuit 450.

According to an embodiment, when the sensor module 176 includes a camera module (e.g., an image sensor), the camera module (e.g., the image sensor) may be arranged below (e.g., under) the display in an under-display camera (UDC) manner.

According to an embodiment, when the sensor module 176 embedded in the display module 160 includes an illuminance sensor, the illuminance sensor may detect an exposure amount of ultraviolet (UV) according to exposure of the display to external light.

According to an embodiment, when the sensor module 176 embedded in the display module 160 includes a biometric sensor (e.g., a fingerprint sensor), the biometric sensor may acquire biometric information (e.g., a fingerprint image) associated with a touch input via a partial region of the display 410.

According to an embodiment, when the sensor module 176 embedded in the display module 160 includes a pressure sensor, the pressure sensor may acquire pressure information associated with a touch input via all or a part of the region of the display 410.

According to an embodiment, the touch sensor 451 or the sensor module 176 may be arranged between pixels of the pixel layer of the display 410, or above or below the pixel layer.

As another example, the sensor module 176 may be arranged in a bezel region of the electronic device (e.g., the electronic device 101 in FIG. 1).

Figure 5:
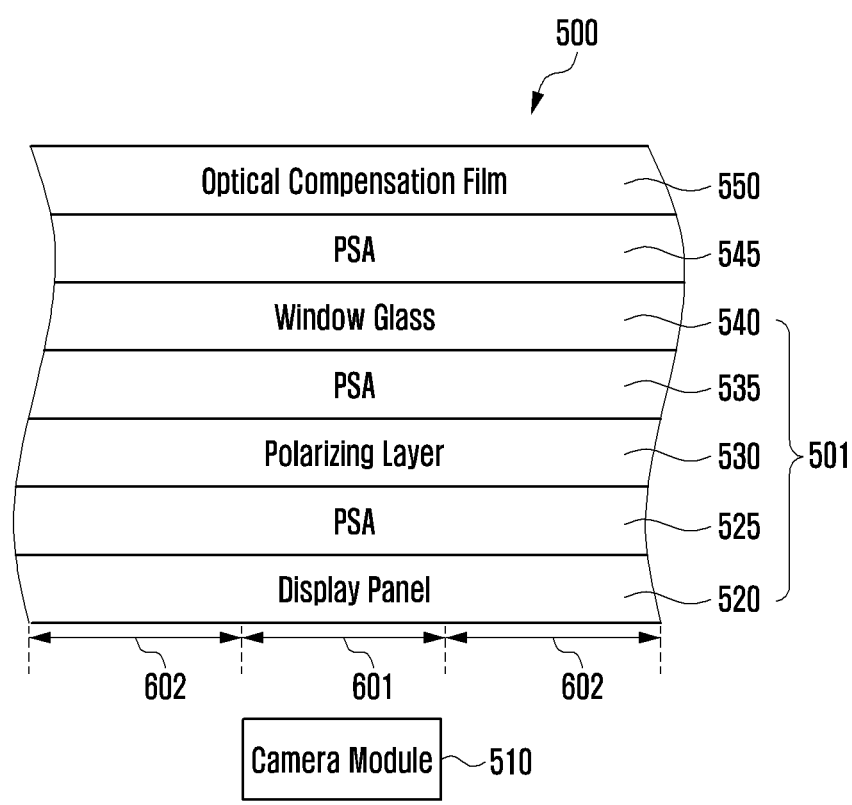
FIG. 5 is a view illustrating an example display and an example camera module (e.g., an image sensor) according to various embodiments of the disclosure.
Figure 6:
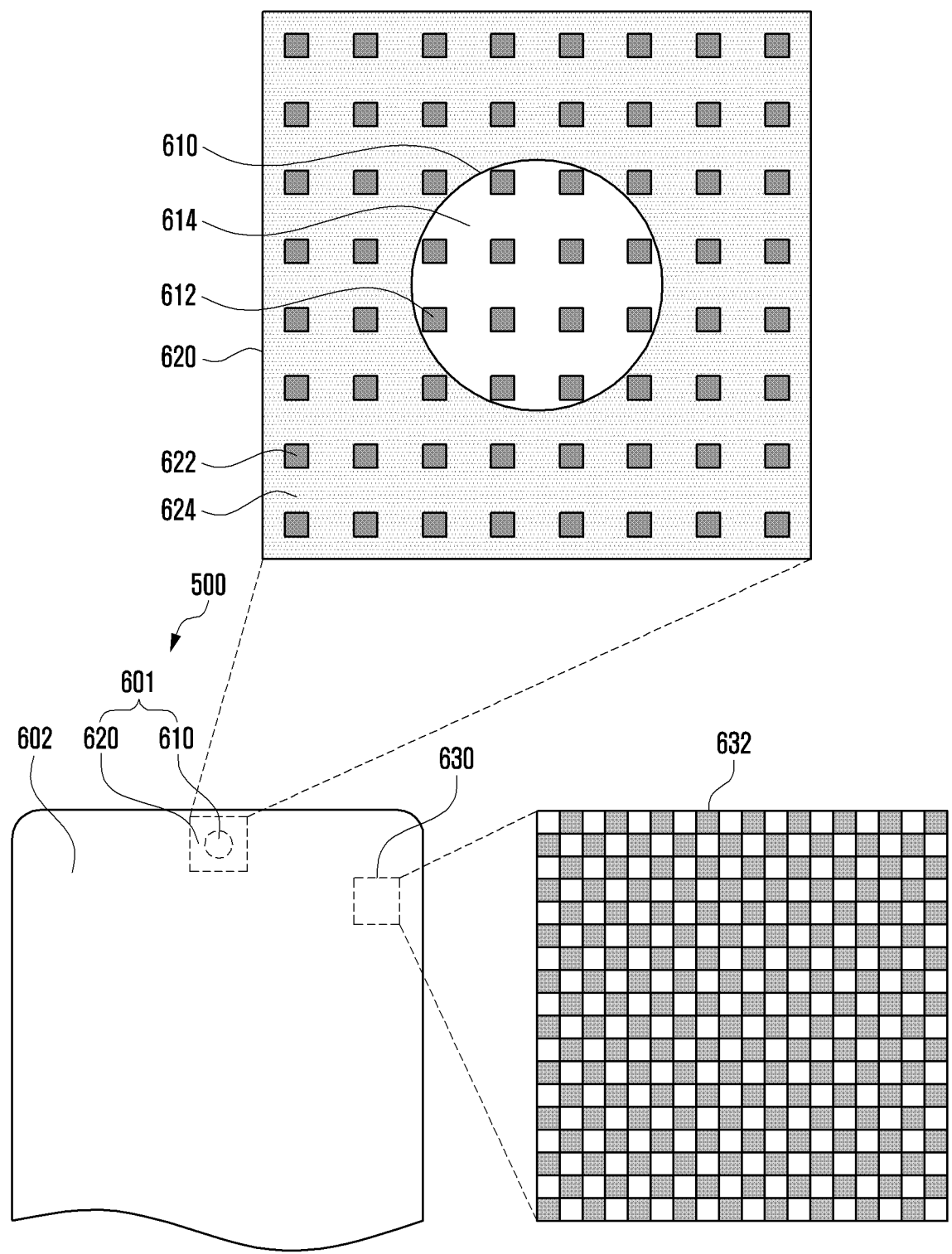
FIG. 6 is a view illustrating a form of pixels arranged in a first region (e.g., an under-display camera region) and a second region (e.g., an active region) of an example display according to various embodiments of the disclosure.

FIG. 5 is a view illustrating an example display and an example camera module (e.g., an image sensor) according to various embodiments of the disclosure. FIG. 6 is a view illustrating a form of pixels arranged in a first region (e.g., an under-display camera region) and a second region (e.g., an active region) of an example display according to various embodiments of the disclosure.

Referring to FIGS. 5 and 6, the electronic device 500 according to various embodiments of the disclosure may include a display 501 and a camera module 510 (e.g., the camera module 205 in FIG. 2A or the camera module arranged in the sensor region 324 in FIG. 3A).

According to an embodiment, the display 501 may include a display panel 520, a polarizing layer 530 (e.g., a polarizing film), and a window glass 540 (e.g., an ultra-thin tempered glass (UTG) or polymer window). The display 501 may further include an optical compensation film (OCF). The optical compensation film may be disposed to correspond to the entire surface of the polarizing layer 530 and the window glass 540.

As an embodiment, when the display 501 is a flexible display, an ultra-thin glass (UTG) or a polymer window may be applied to the window glass 540.

According to an embodiment, the camera module 510 (or an image sensor) may be arranged below (e.g., under) the display 501 in an under-display camera (UDC) manner For example, the camera module 510 may be arranged below (e.g., under) the display panel 520 in an under-display camera (UDC) manner As an embodiment, at least one camera module 510 may be disposed below the display panel 520.

As an embodiment, the display panel 520 of the display 510 may include a first region 601 (e.g., an under-display camera region) corresponding to the camera module 510 and a second region 602 (e.g., an active region). For example, the first region 601 (e.g., under-display camera region) may include a transmissive region 610 which corresponds to the angle of view of the camera module 510 and guides light incident on the camera module 510, and a non-transmissive region 620 which is disposed around the transmissive region 610 and in which driving circuits (e.g., the driving circuits 730 in FIG. 7) for causing the first pixels 612 disposed in the transmissive region 610 and second pixels 622 disposed in the non-transmissive region 620 to emit light are disposed. Light is transmitted through the transmissive region 610, but is not transmitted through the non-transmissive region 620.

As an embodiment, since first pixels 612 and 622 are arranged not only in the second region 602 of the display panel 520 (e.g., the active region), but also in the first region 601 of the display panel 520 (e.g., the under-display camera region), it is possible to display an image.

FIG. 6 illustrates an example in which the first region 601 (e.g., an under-display camera region) is arranged at the central upper end of the electronic device 500. However, the disclosure is not limited thereto, and the first region 601 (e.g., the under-display camera region) may be disposed at any location such as the right upper end, the left upper end, the center, the central right, the central left, the right lower end, the central lower end, or the left lower end of the electronic device 500, without being limited to a position at which it is disposed.

As an embodiment, the polarizing layer 530 may be disposed above the display panel 520. The polarizing layer 530 may polarize incident light and output polarized light. The polarizing layer 530 may polarize light incident on the display panel 520 to prevent deterioration of display quality due to light reflection.

As an embodiment, the display 501 may be configured without the polarizing layer 530.

As an embodiment, the window glass 540 may be disposed on the display panel 520 or the polarizing layer 530. The optical compensation film 550 may be arranged on the window glass 540. The optical compensation film 550 may have a function of a protective film for protecting the window glass 540 and a function of a retardation film for preventing a rainbow color stain according to application of the polarizing layer 530.

A single optical compensation film may be disposed on the window glass 540, or multiple optical compensation films may be disposed. In addition, a single optical compensation film may be disposed on the window glass 540, and a protective layer (or a coating layer) may be disposed on the optical compensation film 550.

The optical compensation film 550 may have a protective film function or a shock absorption function in addition to the optical compensation function. Therefore, from the viewpoint of the protective film function or the shock absorption function, a thicker optical compensation film may be preferable. However, in the case of a foldable phone, since the folding characteristic is important, it is necessary to consider the thickness of the optical compensation film, and the optical compensation film may have a thickness of about 20 to about 100 μm.

A first adhesive member 525 may be provided between the display panel 520 and the polarizing layer 530 so that the display panel 520 and the polarizing layer 530 can be bonded to each other. A second adhesive member 535 may be provided between the polarizing layer 530 and the window glass 540 so that the polarizing layer 530 and the window glass 540 can be bonded to each other. A third adhesive member 545 may be provided between the window glass 540 and the optical compensation film 550 so that the window glass 540 and the optical compensation film 550 can be bonded to each other.

The first, second, and third adhesive members 525, 535, and 545 may include an optical clear adhesive (OCA), a pressure-sensitive adhesive (PSA), a heat-reactive adhesive, a general adhesive, or a double-sided tape. In order to facilitate attachment/detachment of the optical compensation film disposed on the window glass 540, the adhesive force of the third adhesive member 545 may be lower (or weaker) than those of the first adhesive member 525 and the second adhesive member 535.

According to an embodiment, the display panel 520 and the polarizing layer 530 may be integrated with each other. According to an embodiment, when a color filter formed of red (R), green (G), and blue (B) pigments having a polarizing function is arranged on each of the pixels of the display panel 520, the polarizing layer 530 may be omitted. Even when a color filter having a polarizing function is applied, the optical compensation film 550 may be disposed on the window glass 540.

According to an embodiment, the polarizing layer 530 disposed above the display panel 520 may include openings perforated at corresponding positions in order to prevent deterioration of the performance of the camera module 510 due to a refractive index. As an embodiment, at a position corresponding to the camera module 510, the polarizing layer 530 may be processed to be transparent or the polarizing characteristic may be removed from the polarizing layer 530. As an embodiment, the opening-free layers (e.g., the display panel 520) or the touch panel may include a coating capable of index matching in order to minimize a difference in refractive index.

The display panel 520 may be an organic light-emitting diode (OLED) panel, a liquid crystal display (LCD), or a quantum dot light-emitting diode (QLED) panel. The display panel 520 may include a plurality of pixels for displaying an image, and one pixel may include a plurality of sub-pixels. As an embodiment, one pixel may include three colors (e.g., a red sub-pixel, a green sub-pixel, and a blue sub-pixel). As an embodiment, one pixel may include four color sub-pixels, e.g., a red sub-pixel, a green sub-pixel, a blue sub-pixel, and a white sub-pixel. As an embodiment, one pixel may be configured in an RGBG pentile type including one red sub-pixel, two green sub-pixels, and one blue sub-pixel.

According to various embodiments, the display 501 may include a control circuit (not illustrated). According to an embodiment, the control circuit may include a flexible printed circuit board (FPCB) that electrically interconnects a main printed circuit board and the display panel 520, and a display driver IC (DDI) (e.g., the display driver IC 430 in FIG. 4) mounted on the FPCB.

According to an embodiment, the display 501 may additionally include a touch panel (e.g., the touch circuit 450 in FIG. 4). According to an embodiment, the display 501 may operate as an in-cell type or on-cell type touch display depending on a position at which the touch panel is arranged. When the display 501 operates as an in-cell type, on-cell type, or add-on type touch display, the control circuit may include a touch display driver IC (TDDI). As an embodiment, the display 501 may include a sensor module (e.g., the sensor module 176 in FIG. 4).

As an embodiment, in the entire region of the display panel 520, a portion excluding the first region 601 (e.g., an under-display camera region) corresponding to the camera module 510 may be the second region 602 (e.g., an active region).

Since the camera module 510 is arranged under the display panel 520 in an under-display camera (UDC) manner, it is necessary to secure a transmittance in consideration of the quality of a captured image. To this end, the densities of first pixels 612 and second pixels 622 arranged in the first region 601 (e.g., an under-display camera region) and the density of third pixels 632 arranged in the second region 602 (e.g., the active region) may be different from each other.

As an embodiment, the number of second pixels 612 and 622 arranged in the first region 601 (e.g., an under-display camera region) may be reduced to, for example, ½, ⅓, ¼, ⅕, or ⅙ of the numbers of third pixels 632 arranged in the second region 602 (e.g., an active region). FIG. 6 illustrates pixels 632 in a portion 630 of the second region 602 as an example.

As an embodiment, the first pixels 612 may be arranged in an area of, for example, ½, ⅓, ¼, ⅕, or ⅙ of the total area of the transmissive region 610 of the first region 601 (e.g., an under-display camera area), and the remaining portion may be provided as an empty region 614 (or a non-pixel region) in which no pixels are present. The disclosure is not limited thereto, and the ratio of the first pixels 612 arranged in the transmissive region 610 of the first region 601 (e.g., an under-display camera region) may be changed.

As an embodiment, the second pixels 622 may be arranged in an area of, for example, ½, ⅓, ¼, ⅕, or ⅙ of the total area of the non-transmissive region 620 of the first region 601 (e.g., an under-display camera area), and the remaining portion may be provided as an empty region 624 (or a non-pixel region) in which no pixels are present. The disclosure is not limited thereto, and the ratio of the second pixels 622 arranged in the non-transmissive region 620 of the first region 601 (e.g., an under-display camera region) may be changed.

As an embodiment, the density of the first pixels 612 arranged in the transmissive region 610 of the first region 601 (e.g., an under-display camera region) and the density of the second pixels 622 arranged in the non-transmissive region 620 may be equal to each other.

FIG. 6 illustrates that the pixels 612 of the first region 601 (e.g., an under-display camera region) are regularly arranged. Without being limited thereto, the first pixels 612 and the second pixels 622 may be irregularly arranged in the first region 601 (e.g., an under-display camera region). For example, the first pixels 612 may be arranged at irregular intervals. The second pixels 622 may be arranged at irregular intervals.

As an embodiment, the density of the pixels 612 arranged in the transmissive region 610 of the first region 601 (e.g., an under-display camera region) and the density of the pixels 622 arranged in the non-transmissive region 620 may be different from each other.

FIG. 6 illustrates a circular transmissive region 610 of the first region 601 (e.g., an under-display camera region) as an example. However, without being limited thereto, the transmissive region 610 of the first region 601 (e.g., an under-display camera region) may be provided in other shapes such as an elliptical shape or a polygonal shape.

According to an embodiment, since a smaller number of pixels 612 and 622 are arranged in the first region 601 (e.g., an under-display camera region) compared to the second region 602 (e.g., an active region), the first region 601 (e.g., an under-display camera region) and the second region 602 (e.g., an active region) may have different resolutions. As an embodiment, the resolution of the first region 601 (e.g., an under-display camera region) may be lower than that of the second region 602 (e.g., an active region).

Figure 7:
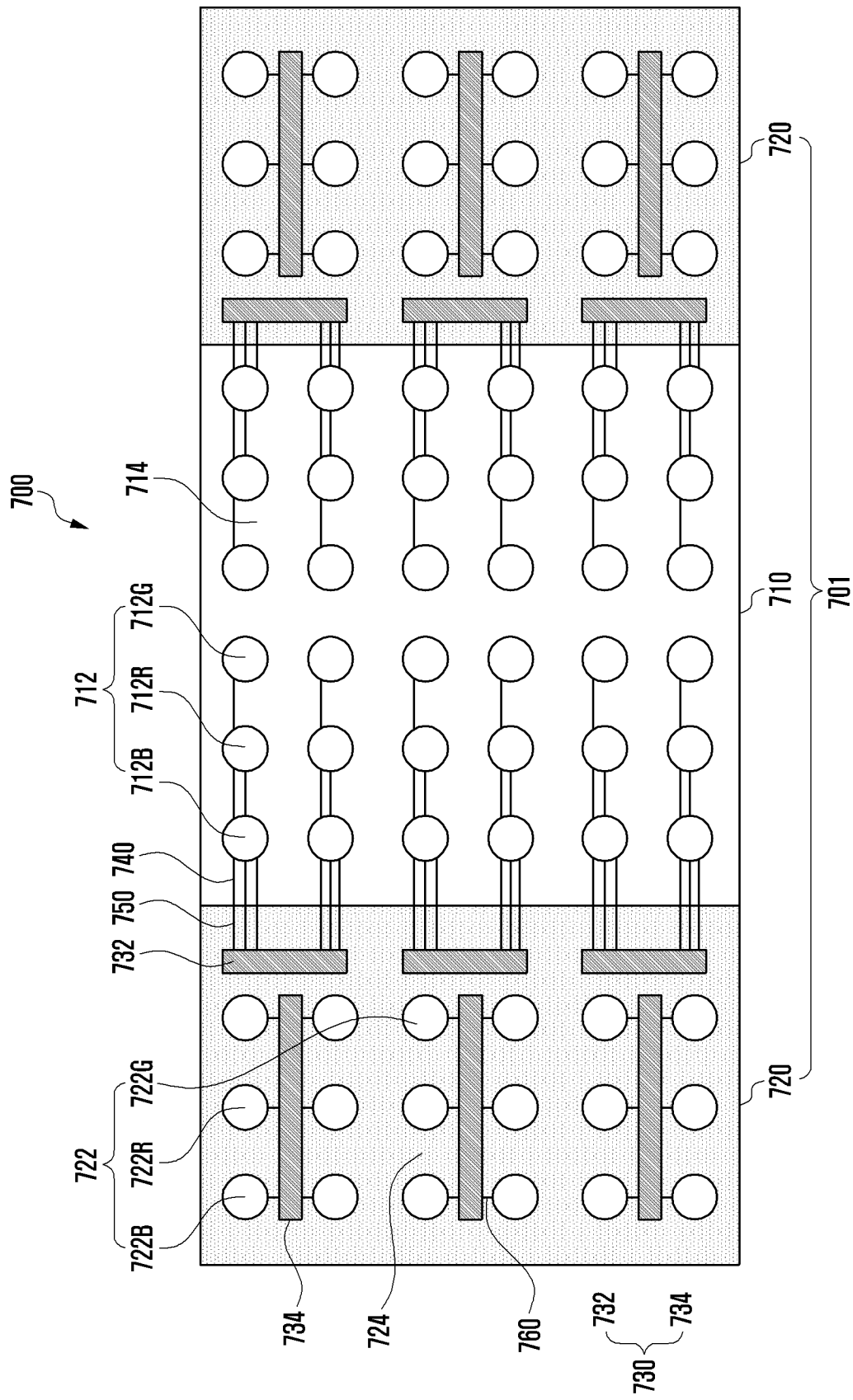
FIG. 7 is a view illustrating how to connect pixels of a first region of an example display (e.g., an under-display camera region) to a driving circuit via transparent wires according to various embodiments of the disclosure.

FIG. 7 is an example view illustrating how to connect pixels of a first region of a display (e.g., an under-display camera region) to a driving circuit via transparent wires according to various embodiments of the disclosure.

Figure 8A:
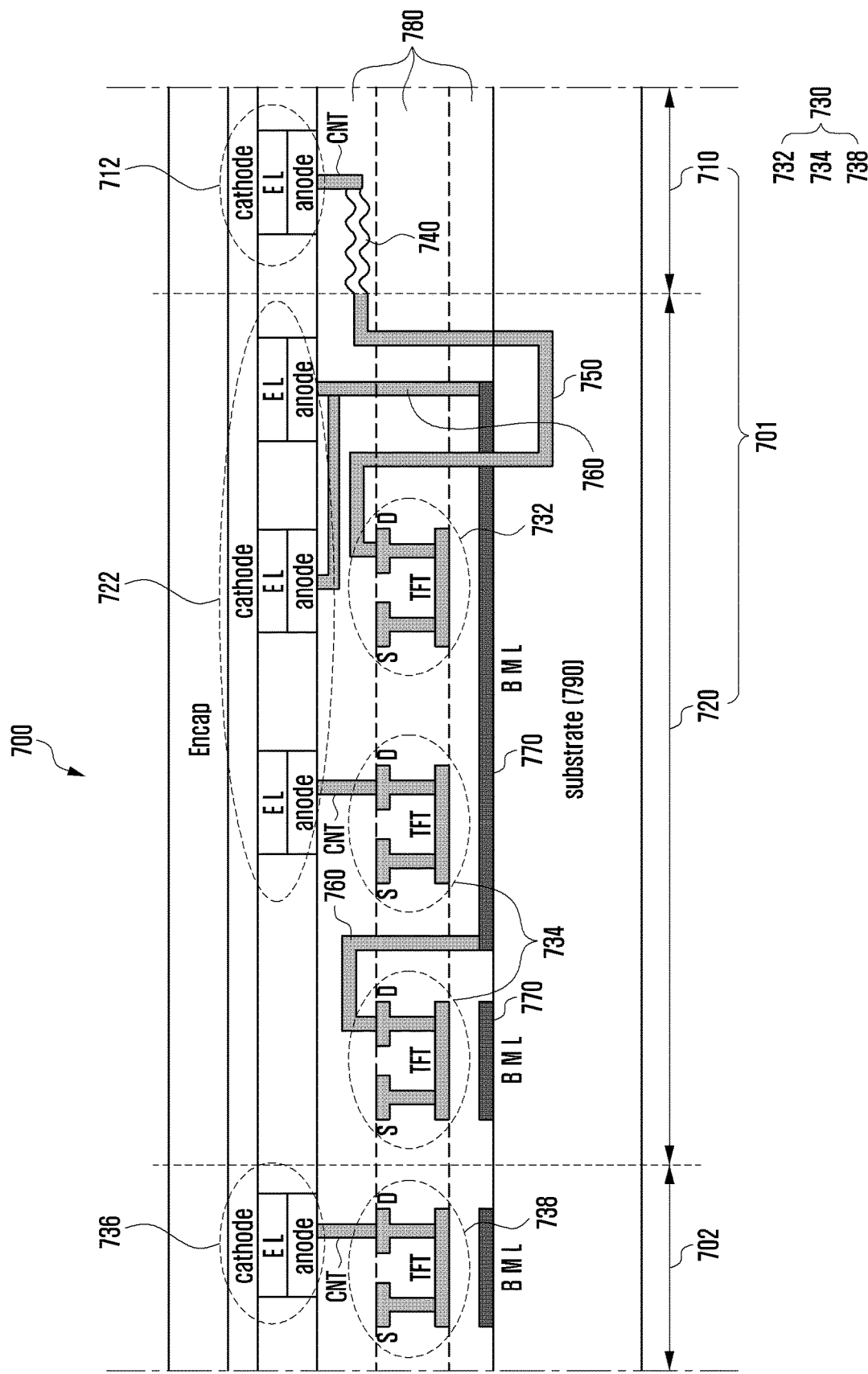
FIGS. 8A and 8B illustrate example connection wires (e.g., transparent wires) electrically interconnecting pixels arranged in a transmissive region of a first region of a display (e.g., an under-display camera region) and a driving circuit arranged in a non-transmissive region according to various embodiments of the disclosure.
Figure 8B:
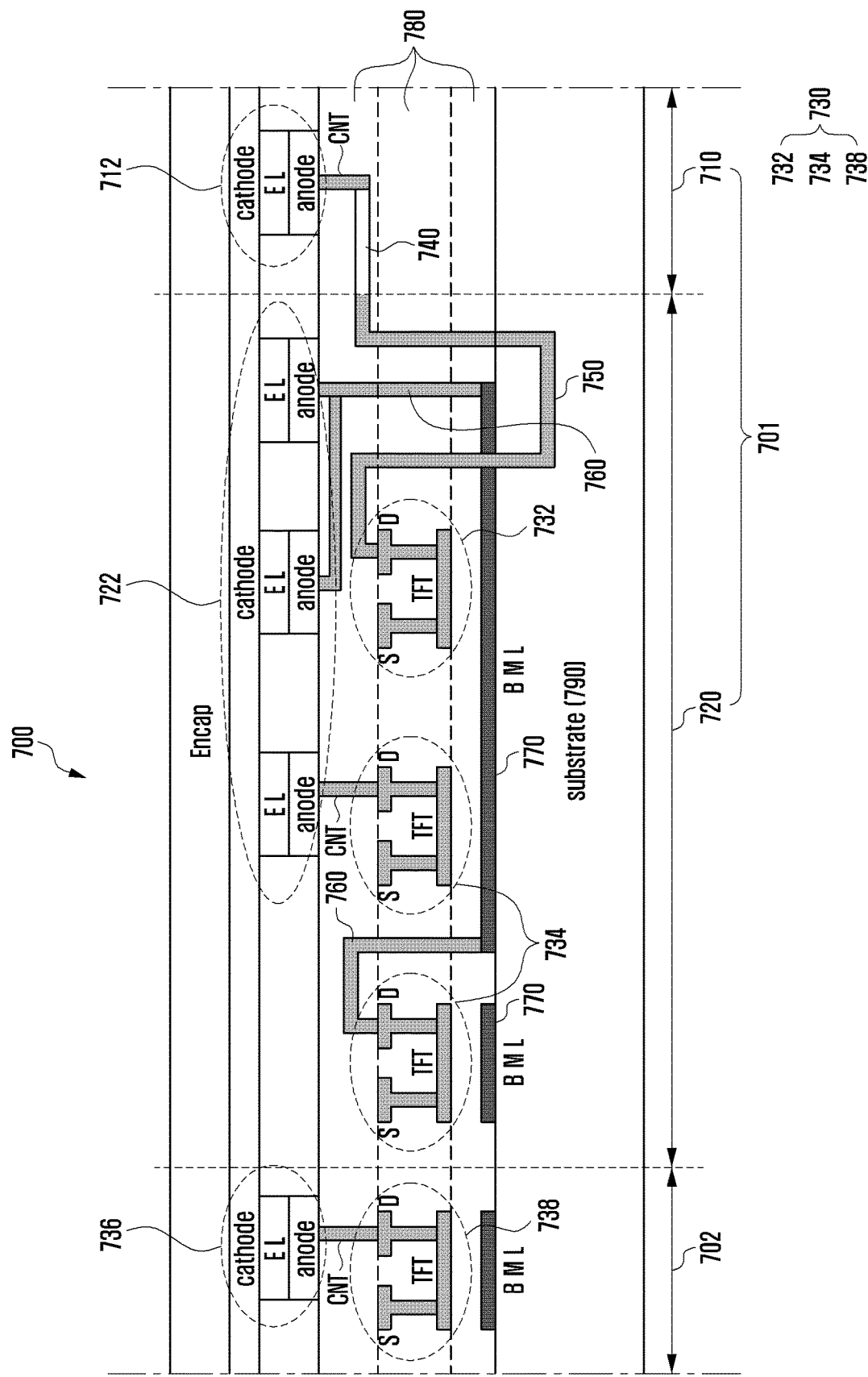

As an embodiment, the display 700 may include a first region 701 (e.g., an under-display camera region) corresponding to a camera module (e.g., the camera module 510 in FIG. 5) and a second region (e.g., an active region) (e.g., the second region 702 in FIGS. 8A and 8B). As an example, the first region 701 (e.g., an under-display camera region) may include a transmissive region 710 which corresponds to the angle of view of the camera module (e.g., the camera module 510 of FIG. 5) and through which light is transmitted, and a non-transmissive region 720 which is disposed around the transmissive region 710 and through which light is not transmitted.

As an embodiment, a plurality of pixels and driving circuits for driving the pixels may be arranged in the second region (e.g., an active region) (e.g., the second region 702 in FIGS. 8A and 8B). The first pixels 712 arranged in the transmissive region 710 may be driven using some of the driving circuits arranged in the second region (e.g., an active region) (e.g., the second region 702 of FIGS. 8A and 8B).

As an embodiment, the transmissive region 710 may include first pixels 712 and an empty region 714 (or a non-pixel region). Light may be transmitted through the empty region 714, and the light may be incident on a camera module (e.g., the camera module 510 in FIG. 5). For example, each of the first pixels 712 may include a red sub-pixel 712R, a green sub-pixel 712G, and a blue sub-pixel 712B.

As an embodiment, the non-transmissive region 720 may include second pixels 722 and an empty region 724 (or a non-pixel region). The driving circuits 730 may be arranged in the empty region 724 (or a non-pixel region).

As an embodiment, each of the second pixels 722 may include a red sub-pixel 722R, a green sub-pixel 722G, and a blue sub-pixel 722B. For example, in the non-transmissive region 720, driving circuits 730 may be arranged around the transmissive region 710 to cause the first pixels 612 arranged in the transmissive region 710 and the second pixels 622 arranged in the non-transmissive region 620 to emit light. For example, the driving circuits 730 may include first driving circuits 732 for driving the first pixels 712 arranged in the transmissive region 710 and second driving circuits 734 for driving the second pixels 722 arranged in the non-transmissive region 720.

As an embodiment, the second region 702 (e.g., an active region) may include pixels and driving circuits.

As an embodiment, driving circuits for driving pixels arranged in the transmissive region 710 are further arranged in the non-transmissive region 720 of the first region 701 (e.g., an under-display camera region).

As an embodiment, a driving circuit in the first region 701 may control a plurality of pixels.

As an embodiment, the density of the first pixels 712 arranged in the transmissive region 710 of the first region 701 (e.g., an under-display camera region) and the density of the second pixels 722 arranged in the non-transmissive region 720 may be equal to each other.

As an embodiment, the density of the pixels 712 arranged in the transmissive region 710 of the first region 701 (e.g., an under-display camera region) and the density of the pixels 722 arranged in the non-transmissive region 720 may be different from each other.

As an embodiment, since the first pixels 712 are arranged in the transmissive region 710 of the first region 701 (e.g., an under-display camera region) and the second pixels 722 are arranged in the non-transmissive region 720, an image may also be displayed in the first region 701 (e.g., an under-display camera region).

As an embodiment, in order to increase the light transmission characteristic of the transmissive region 710 of the first region 701 (e.g., an under-display camera region), connection wires 740 (e.g., transparent wires) formed of a transparent material (e.g., ITO, or ITZO) may be arranged. The connection wires 740 (e.g., transparent wires) arranged in the transmissive region 710 may be connected to first metal wires 750 arranged in the non-transmissive region 720, and the first metal wires 750 may be electrically connected to the first driving circuits 732. Via the connection wires 740 (e.g., transparent wires) arranged in the transmissive region 710 and the first metal wires 750 arranged in the non-transmissive region 720, the OLEDs of the red sub-pixels 712R, the green sub-pixels 712G, and the blue sub-pixels 712B of the first pixels 712 may be electrically connected to the first driving circuits 732.

As an embodiment, second metal wires 760 may be arranged in the non-transmissive region 720 of the first region 701 (e.g., an under-display camera region). Via the second metal wires 760, the OLEDs of the red sub-pixels 722R, the green sub-pixels 722G, and the blue sub-pixels of the second pixels 722 arranged in the non-transmissive region 720 of the first region 701 (e.g., an under display camera region) may be electrically connected to the second driving circuits 734.

FIGS. 8A and 8B are example views illustrating connection wires (e.g., transparent wires) electrically interconnecting the pixels arranged in a transmissive region of a first region (e.g., an under-display camera region) of a display and driving circuits arranged in a non-transmissive region according to various embodiments of the disclosure.

Referring to FIGS. 8A and 8B, a display panel 700 of an electronic device (e.g., the electronic device 101 FIG. 1, the electronic device 200 in FIG. 2A, the electronic device 300 in FIG. 3A, or the electronic device 500 in FIG. 5) according to various embodiments of the disclosure may include a first region 701 (e.g., an under-display camera region) and a second region 702 (e.g., an active region). The display panel 700 may include a substrate 790, a plurality of driving circuits 730 (e.g., driving circuits 732, 734, and 738) arranged on the substrate 790, a plurality of insulating films 780 provided to cover the plurality of driving circuits 732, 734, and 738, a plurality of pixels 712, 722, and 736 arranged on the plurality of driving circuits 732, 734, and 738, a light blocking layer 770 (e.g., a bottom metal layer (BML) arranged under the plurality of driving circuits 732, 734, and 738, and an encapsulation layer Encap that encapsulates the plurality of pixels 712, 722, and 736. The plurality of driving circuits 730 may include a first driving circuit 732, a second driving circuit 734, and a third driving circuit 738.

As an embodiment, the OLEDs of the plurality of pixels 712, 722, and 736 (e.g., the OLED 1810 in FIG. 18) may include an anode electrode, a light-emitting active layer (EL), and a cathode electrode. The cathode electrode may be provided in common to the plurality of pixels 712, 722, and 736. The plurality of driving circuits 732, 734, and 738 may be electrically connected to the anode electrode of an OLED (e.g., the OLED 1810 in FIG. 18). The plurality of driving circuits 732, 734, and 738 (e.g., the driving transistor 1820 in FIG. 18) may include a gate, a source S, and a drain D, and a channel may be formed between the source S and the drain D by a voltage applied to the gate. The driving currents of the plurality of driving circuits 732, 734, and 738 are applied to the OLEDs (e.g., the OLED 1810 in FIG. 18), and the OLEDs (e.g., the OLED 1810 in FIG. 18) may emit light with a luminance proportional to the applied driving current. As an embodiment, in the transmissive region 710 of the first area 701 (e.g., an under-display camera region) of the display panel 700, the first pixels 712 and the connection wires 740) (e.g., transparent wires) may be arranged. In the non-transmissive region 720 of the first region 701 (e.g., an under-display camera region), second pixels 722, first metal wires 750, second metal wires 760, and driving circuits 730 may be arranged. In the second region 702 (e.g., an active region) of the display panel 700, third pixels 736 and driving circuits 738 may be arranged.

As an embodiment, the anode electrodes of the first pixels 712 arranged in the transmissive region 710 of the first region 701 (e.g., an under-display camera region) may be electrically connected to a first side of the connection wires 740 (e.g., transparent wires) via a contact portion CNT. A second side of the connection wires 740 (e.g., transparent wires) may be electrically connected to a first side of the first metal wires 750 arranged in the non-transmissive region 720 of the first region 701 (e.g., an under-display camera region). A second side of the first metal wires 750 may be electrically connected to the first driving circuit 732 arranged in the non-transmissive region 720. The first pixels 712 may be electrically connected to the first driving circuit 732 arranged in the non-transmissive region 720 via the connection wires 740 (e.g., transparent wires) and the first metal wires 750.

As an embodiment, the anode electrodes of the second pixels 722 arranged in the non-transmissive region 720 of the first region 701 (e.g., an under-display camera region) may be electrically connected to a first side of the second metal wires 760 via a contact portion CNT. A second side of the second metal wires 760 may be electrically connected to a first side of the light blocking layer 770 (e.g., a bottom metal layer (BML)). A second side of the light blocking layer 770 (e.g., a bottom metal layer (BML)) may be electrically connected to the second driving circuit 734 arranged in the non-transmissive region 720. The second pixels 722 may be electrically connected to the second driving circuit 734 arranged in the non-transmissive region 720 via the second metal wires 760 and the light blocking layer 770 (e.g., a bottom metal layer (BML)).

Figure 9:
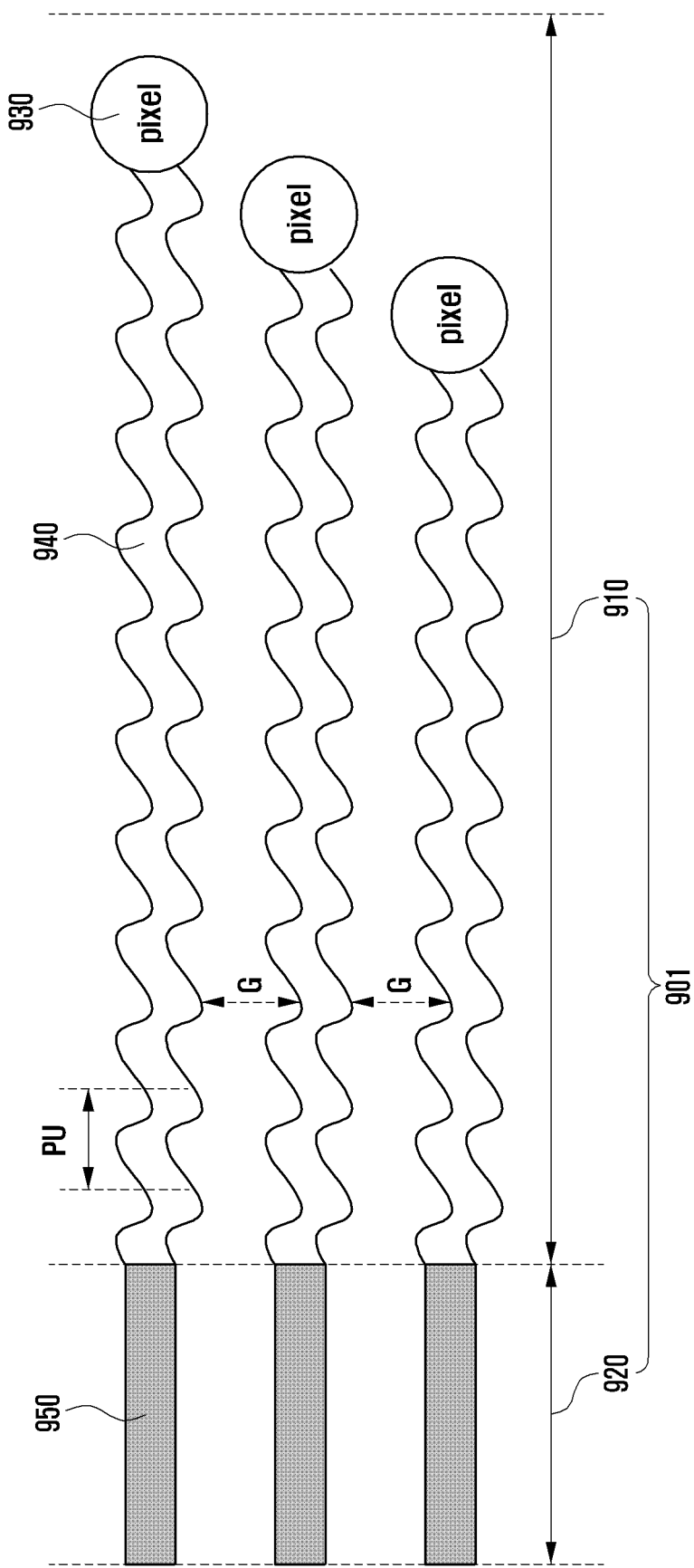
FIG. 9 is a view illustrating example connection wires according to various embodiments of the disclosure.

As an embodiment, the connection wires 740 (e.g., transparent wires) (e.g., the connection wires 940 in FIG. 9) may be arranged in a form having a predetermined curvature. For example, FIG. 8A illustrates the connection wires 740 (e.g., transparent wires) (e.g., the connection wires 940 of FIG. 9) in a form having a predetermined curvature in order to help understanding that the connection wires 740 (e.g., transparent wires) (e.g., the connection wires 940 of FIG. 9) are provided in a form having a predetermined curvature. When the connection wires 740 (e.g., transparent wires) (e.g., the connection wires 940 in FIG. 9) are viewed in a plan view as illustrated in FIG. 9, the connection wires 740 (e.g., transparent wires) may be seen as having a certain curvature. In a cross-sectional view, the connection wires may be seen as linear connection wires 740a as illustrated in FIG. 8B.

As an embodiment, the connection wires 740 (e.g., transparent wires) may be provided to be bent left and right, up and down, or up and down, left and right.

By arranging the connection wires 740 (e.g., transparent wires) in the transmissive region 710 of the first region 701 (e.g., an under-display camera region) of the display panel 700, it is possible to increase light transmittance. Here, due to the difference in refractive index between the connection wires 740 (e.g., transparent wires) and the plurality of insulating films 780, spreading and flare of light incident on the transmissive region 710 of the display 700 may occur, which may cause the image quality of the captured image of the camera module (e.g., the camera module 510 in FIG. 5) to be deteriorated. In an electronic device (e.g., the electronic device 101 in FIG. 1, the electronic device 200 in FIG. 2A, the electronic device 300 in FIG. 3A, or the electronic device 500 in FIG. 5) including a camera module (e.g., the camera module 510 in FIG. 5) according to various embodiments of the disclosure, it is possible to suppress light spreading and flare by changing the shape and arrangement form of the connection wires 740 (e.g., transparent wires) arranged in the transmissive region 710 of the first region 701 of the display (e.g., an under-display camera region).

FIG. 9 is a view illustrating example connection wires according to various embodiments of the disclosure.

Referring to FIG. 9, connection wires 940 may be arranged in a transmissive region (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 940 may be electrically connected to pixels 930 arranged in the transmissive region 910. A second side of the connection wires 940 may be electrically connected to a first side of the first metal wires 950 arranged in a non-transmissive region 920 (e.g., the non-transmissive region 720 of FIG. 7 or the non-transmissive region 720 of FIGS. 8A and 8B). A second side of the first metal wires 950 may be electrically connected to the first driving circuit (e.g., the first driving circuit 732 in FIG. 7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the connection wires 940 may be configured in a curved shape. Adjacent connection wires 940 may be arranged with the same interval G therebetween. Here, since the positions at which the first pixels 930 are arranged in the transmissive region 910 are different from each other, the lengths of the connection wires 940, which are connected to the first pixels 930, respectively, may be different from each other. As another embodiment, the connection wires 940 may be arranged with different intervals therebetween.

As an embodiment, the connection wires 940 may be provided in a form in which pattern units PU having a predetermined curvature are connected to each other. The pattern units PU of the connection wires 940 may be equal to each other in height (e.g., amplitude) and length (e.g., wavelength). However, without being limited thereto, the pattern units PU of the connection wires 940 may be different from each other in height (e.g., amplitude) and/or length (e.g., wavelength).

In an example electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging curved connection wires 940 in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is refracted.

Figure 10:
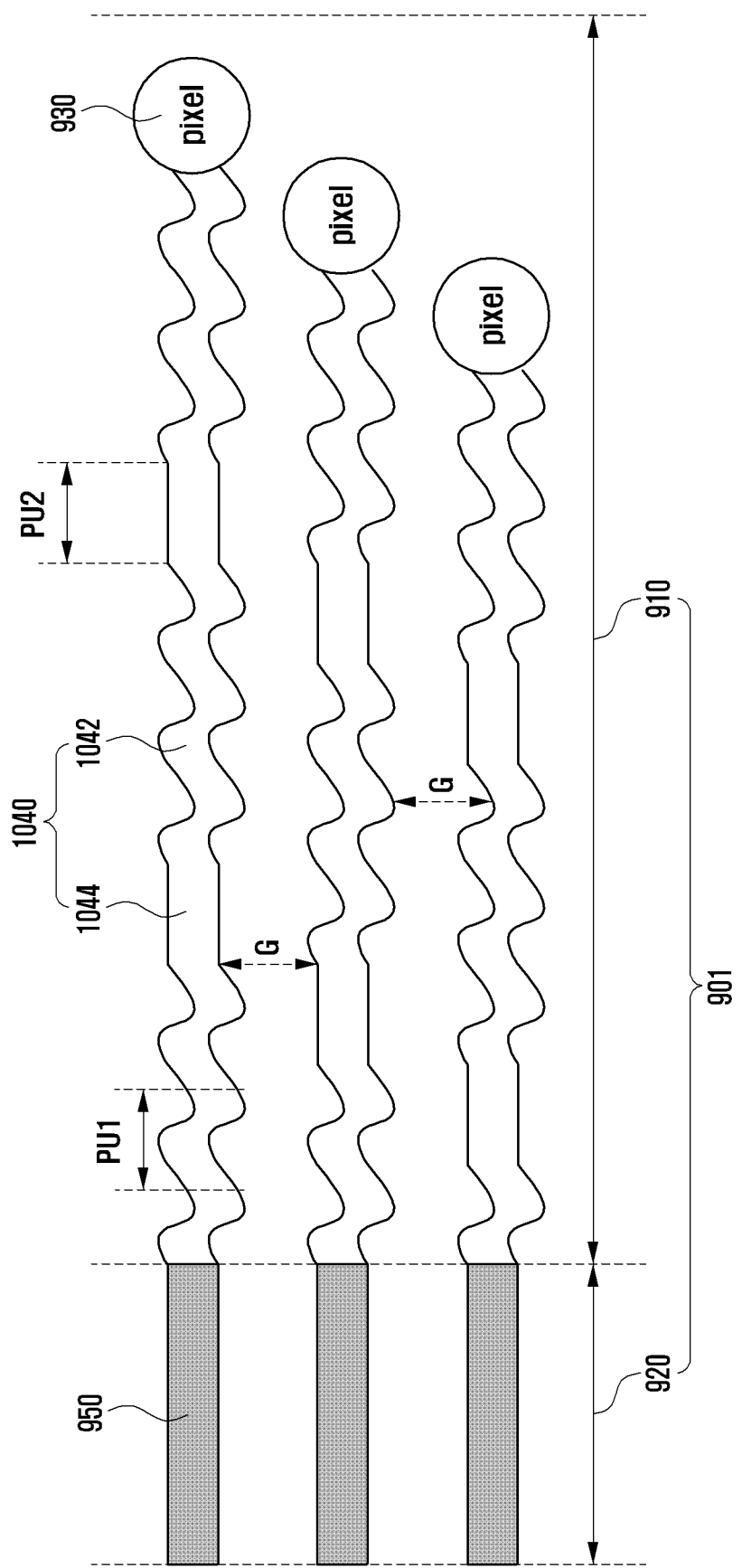
FIG. 10 is a view illustrating example connection wires according to various embodiments of the disclosure.

FIG. 10 is a view illustrating example connection wires according to various embodiments of the disclosure.

Referring to FIG. 10, connection wires 1040 may be arranged in a transmissive region 910 (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 1040 may be electrically connected to pixels 930 arranged in the transmissive region 910. A second side of the connection wires 1040 may be electrically connected to a first side of the first metal wires 950 arranged in a non-transmissive region 920 (e.g., the non-transmissive region 720 in FIG. 7 or the non-transmissive region 720 in FIGS. 8A and 8B). A second side of the first metal wires 950 may be electrically connected to the first driving circuit (e.g., the first driving circuit 732 in FIG. 7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the connection wires 1040 may include at least one curved region 1042 and at least one linear region 1044. For example, the curved regions 1042 of the connection wires 1040 may include curved first pattern units PU1. For example, the linear regions 1044 of the connection wires 1040 may include linear second pattern units PU2.

As an embodiment, the adjacent connection wires 1040 may be arranged with the same interval G therebetween. However, without being limited thereto, the connection wires 1040 may be arranged with different intervals therebetween. Here, since the positions at which the first pixels 930 are arranged in the transmissive region 910 are different from each other, the lengths of the connection wires 1040, which are connected to the first pixels 930, respectively, may be different from each other.

As an embodiment, the first pattern units PU1 of the connection wires 1040 may be equal to each other in height (e.g., amplitude) and length (e.g., wavelength). However, without being limited thereto, the first pattern units PU1 of the connection wires 1040 may be different from each other in height (e.g., amplitude) and/or length (e.g., wavelength).

In an electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging connection wires 1040 including a curved shape and a linear shape in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is refracted.

Figure 11:
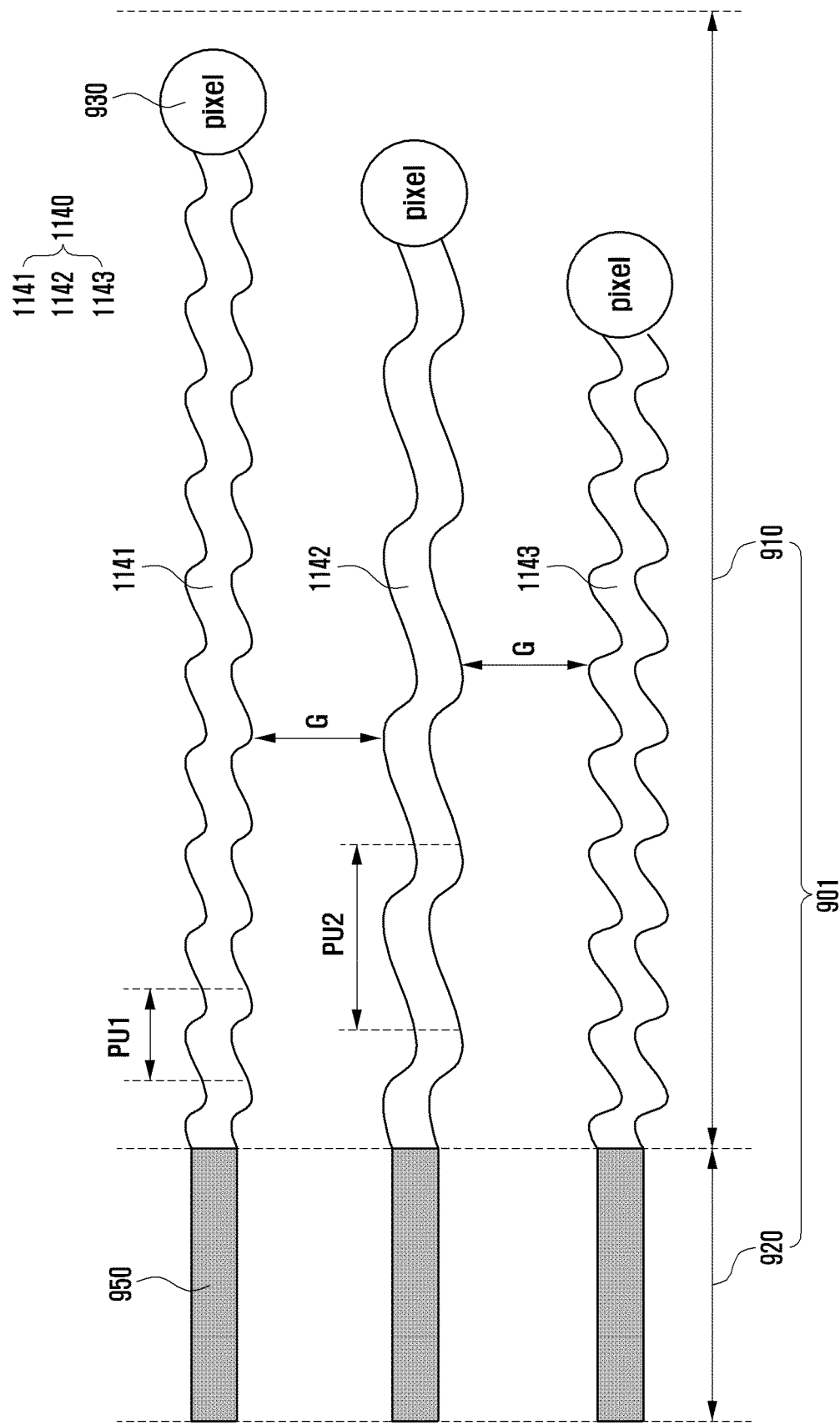
FIG. 11 is a view illustrating example connection wires according to various embodiments of the disclosure.

FIG. 11 is a view illustrating example connection wires according to various embodiments of the disclosure.

Referring to FIG. 11, connection wires 1140 may be arranged in a transmissive region 910 (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 1140 may be electrically connected to pixels 930 arranged in the transmissive region 910. A second side of the connection wires 1140 may be electrically connected to a first side of the first metal wires 950 arranged in a non-transmissive region 920 (e.g., the non-transmissive region 720 in FIG. 7 or the non-transmissive region 720 in FIGS. 8A and 8B). A second side of the first metal wires 950 may be electrically connected to the first driving circuit (e.g., the first driving circuit 732 in FIG. 7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the connection wires 1140 may include first connection wires 1141, second connection wires 1142, and third connection wires 1143. Adjacent connection wires 1140 may be arranged with the same interval G therebetween. However, without being limited thereto, the connection wires 1140 may be arranged with different intervals therebetween. Here, since the positions at which the first pixels 930 are arranged in the transmissive region 910 are different from each other, the lengths of the first connection wires 1141, the second connection wires 1142, and the third connection wires 1143 connected to the first pixels 930 may be different from each other.

As an embodiment, the adjacent first connection wires 1141 and second connection wires 1142 may be arranged in a curved shape. As an example, the first connection wires 1141 may be provided in a form in which the first pattern units PU1 having a predetermined curvature are connected to each other. The second connection wires 1142 may be provided in a form in which the second pattern units PU2 having a predetermined curvature are connected to each other. The heights (e.g., amplitudes) of the first pattern units PU1 of the first connection wires 1141 and the second pattern units PU2 of the second connection wires 1142 may be equal to each other. The lengths (e.g., wavelengths) of the first pattern units PU1 of the first connection wires 1141 and the second pattern units PU2 of the second connection wires 1142 may be different from each other.

In an electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging curved connection wires 1140 (e.g., connection wires 1141, 1142, and 1143) in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is refracted.

Figure 12:
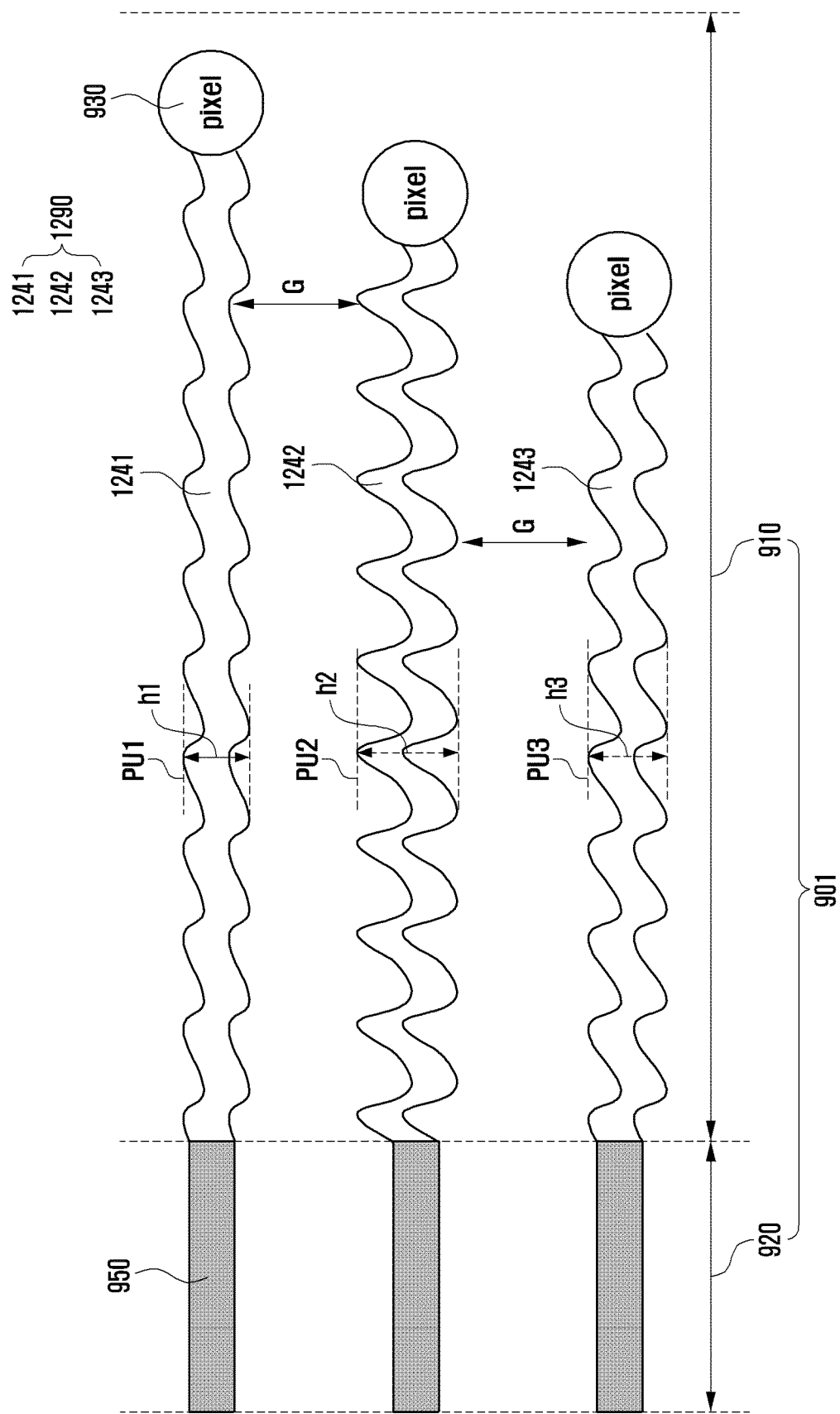
FIG. 12 is a view illustrating example connection wires according to various embodiments of the disclosure.

FIG. 12 is a view illustrating example connection wires according to various embodiments of the disclosure.

Referring to FIG. 12, connection wires 1240 may be arranged in a transmissive region 910 (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 1240 may be electrically connected to pixels 930 arranged in the transmissive region 910. A second side of the connection wires 1240 may be electrically connected to a first side of the first metal wires 950 arranged in a non-transmissive region 920 (e.g., the non-transmissive region 720 of FIG. 7 or the non-transmissive region 720 of FIGS. 8A and 8B). A second side of the first metal wires 950 may be electrically connected to the first driving circuit (e.g., the first driving circuit 732 in FIG. 7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the connection wires 1240 may include first connection wires 1241, second connection wires 1242, and third connection wires 1243. Adjacent connection wires 1240 may be arranged with the same interval G therebetween. However, without being limited thereto, the connection wires 1240 may be arranged with different intervals therebetween. Here, since the positions at which the first pixels 930 are arranged in the transmissive region 910 are different from each other, the lengths of the first connection wires 1241, the second connection wires 1242, and the third connection wires 1243 connected to the first pixels 930 may be different from each other.

As an embodiment, the adjacent first connection wires 1241 and second connection wires 1242 may be arranged in a curved shape. As an example, the first connection wires 1241 may be provided in a form in which the first pattern units PU1 having a predetermined curvature are connected to each other. The second connection wires 1242 may be provided in a form in which the second pattern units PU2 having a predetermined curvature are connected to each other. The third connection wires 1243 adjacent to the second connection wires 1242 may be provided in a form in which third pattern units PU3 having a predetermined curvature are connected to each other.

As an embodiment, the first connection wires 1241 and the second connection wires 1242 may be arranged adjacent to each other. The second connection wires 1242 and the third connection wires 1243 may be arranged adjacent to each other. As an example, the heights (e.g., amplitudes) of the first pattern units PU1 of the first connection wires 1241 and the second pattern units PU2 of the second connection wires 1242 may be different from each other. For example, the first pattern units PU1 of the first connection wires 1241 may have a first height h1, and the second pattern units PU2 of the second connection wires 1242 may have a second height h2 greater than the first height h1.

As an embodiment, the lengths (e.g., wavelengths) of the first pattern units PU1 of the first connection wires 1241 and the second pattern units PU2 of the second connection wires 1242 may be equal to each other. As an example, the heights (e.g., amplitudes) of the second pattern units PU2 of the second connection wires 1242 and the third pattern units PU3 of the third connection wires 1243 may be different from each other. For example, the second pattern units PU2 of the second connection wires 1242 may have a second height h2, and the third pattern units PU3 of the third connection wires 1243 may have a third height h3 smaller than the second height h2. The lengths (e.g., wavelengths) of the second pattern units PU2 of the second connection wires 1242 and the third pattern units PU3 of the third connection wires 1243 may be equal to each other.

In an electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging curved connection wires 1240 (e.g., connection wires 1241, 1242, and 1243) in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is refracted.

Figure 13:
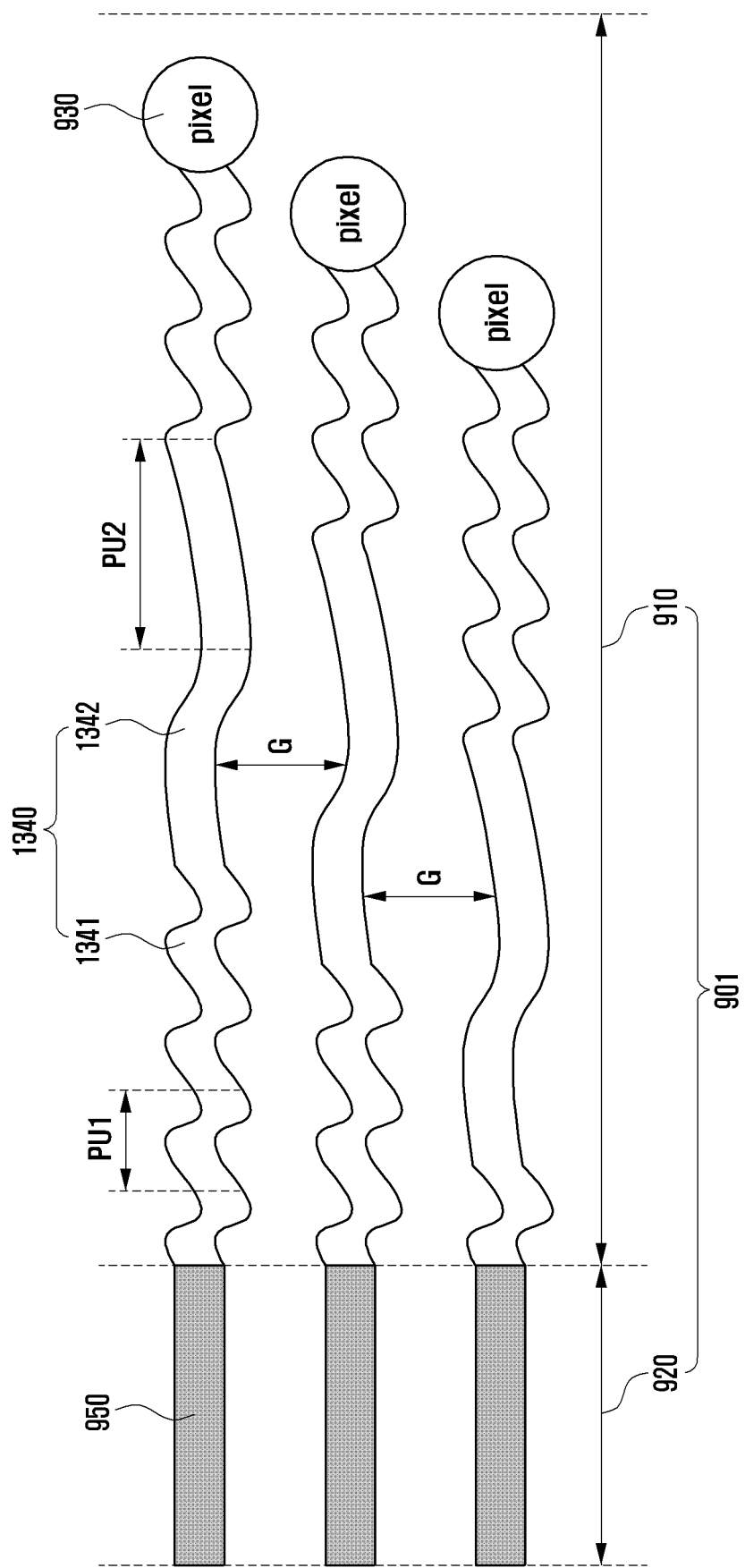
FIG. 13 is a view illustrating example connection wires according to various embodiments of the disclosure.

FIG. 13 is a view illustrating example connection wires according to various embodiments of the disclosure.

Referring to FIG. 13, connection wires 1340 may be arranged in a transmissive region 910 (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 1340 may be electrically connected to pixels 930 arranged in the transmissive region 910. A second side of the connection wires 1340 may be electrically connected to a first side of the first metal wires 950 arranged in a non-transmissive region 920 (e.g., the non-transmissive region 720 of FIG. 7 or the non-transmissive region 720 of FIGS. 8A and 8B). A second side of the first metal wires 950 may be electrically connected to the first driving circuit (e.g., the first driving circuit 732 in FIG.

7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the adjacent connection wires 1340 may be arranged with the same interval G therebetween. However, without being limited thereto, the connection wires 1340 may be arranged with different intervals therebetween. Here, since the positions at which the first pixels 930 are arranged in the transmissive region 910 are different from each other, the lengths of the connection wires 1340, which are connected to the first pixels 930, respectively, may be different from each other.

As an embodiment, the connection wires 1340 may be arranged in a curved shape. The connection wires 1340 may be provided in a form in which first pattern units PU1 having a first curvature and second pattern units PU2 having a second curvature are connected to each other. As an example, heights (e.g., amplitudes) of the first pattern units PU1 and the second pattern units PU2 within one connection wire may be equal to each other. As an example, in one connection wire, a first length 1341 (e.g., wavelength) of the first pattern units PU1 and a second length 1342 (e.g., wavelength) of the second pattern units PU2 may be different from each other.

In an electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging curved connection wires 1340 in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is refracted.

Figure 14:
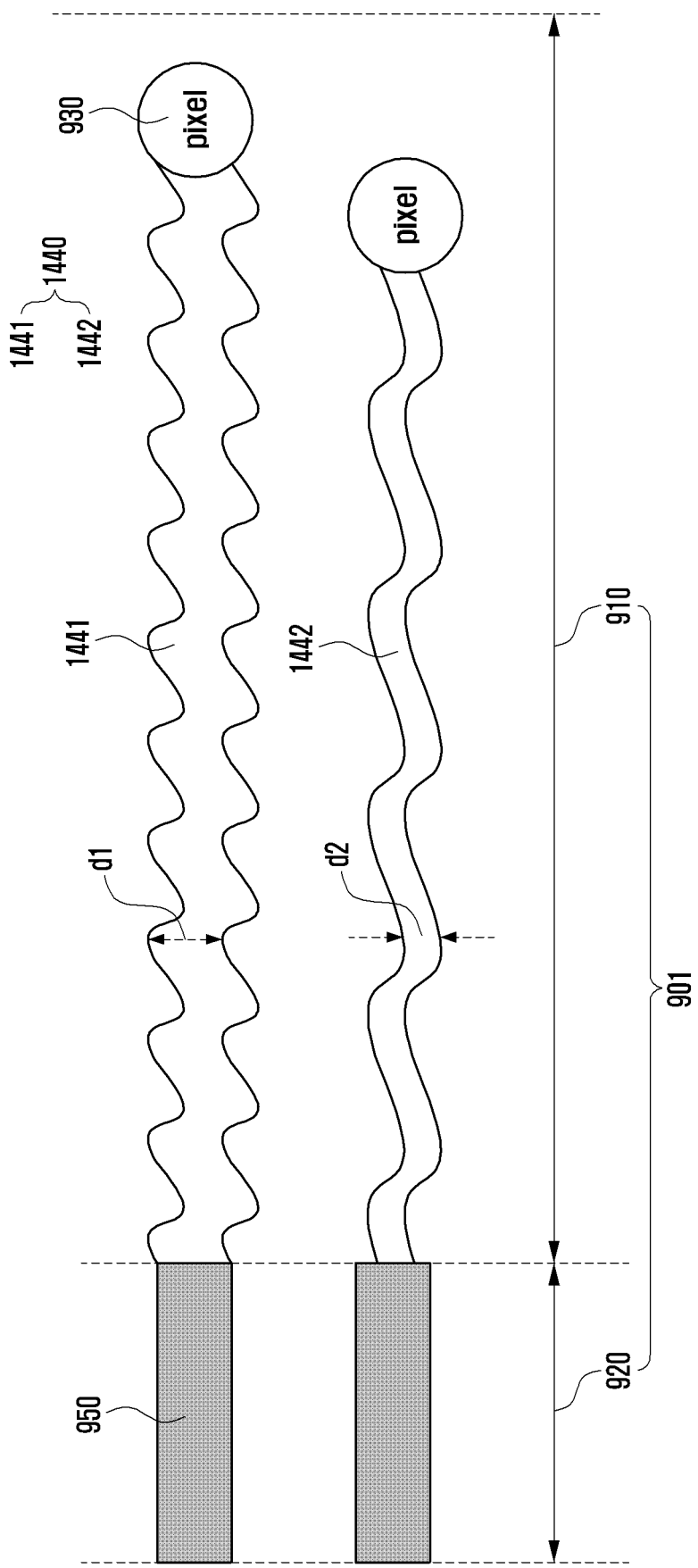
FIG. 14 is a view illustrating example connection wires according to various embodiments of the disclosure.

FIG. 14 is a view illustrating example connection wires according to various embodiments of the disclosure.

Referring to FIG. 14, connection wires 1440 may be arranged in a transmissive region (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 1440 may be electrically connected to pixels 930 arranged in the transmissive region 910. A second side of the connection wires 1440 may be electrically connected to a first side of the first metal wires 950 arranged in a non-transmissive region 920 (e.g., the non-transmissive region 720 of FIG. 7 or the non-transmissive region 720 of FIGS. 8A and 8B). A second side of the first metal wires 950 may be electrically connected to the first driving circuit (e.g., the first driving circuit 732 in FIG. 7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the connection wires 1440 may include first connection wires 1441 and second connection wires 1442 which are arranged adjacent to each other. Since the positions at which the first pixels 930 are arranged in the transmissive region 910 are different from each other, the first length of the first connection wires 1441 connected to respective first pixels 930 and the second length of the second connection wires 1442 connected to respective first pixels 930 may be different from each other.

Since the first length of the first connection wires 1441 and the second length of the second connection wires 1442 are different from each other, the first resistance of the first connection wires 1441 and the second resistance of the second connection wires 1442 may be different from each other. When the first resistance of the first connection wires 1441 and the second resistance of the second connection wires 1442 are different from each other, a difference occurs in the driving current supplied to the pixels 930. As a result, a difference in emission luminance may occur between the pixels 930.

As an embodiment, in the electronic device according to embodiments of the disclosure, in order to prevent occurrence of a difference in the driving current supplied to the pixels 930, the first connection wires 1441 and the second connection wires 1442 may have different line widths depending on the lengths thereof. For example, the relatively long first connection wires 1441 may have a first line width d1. For example, the second connection wires 1442 having a smaller length than the first connection wires 1441 may have a second line width d2 smaller than the first line width d1. In this way, by configuring the first connection wires 1441 and the second connection wires 1442 in different line widths depending on the lengths of the first connection wires 1441 and the second connection wires 1442, the first connection wires 1441 and the second connection wires having different lengths 1442 may be matched to each other to have substantially the same resistance.

In an electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging curved connection wires 1440 (e.g., connection wires 1441 and 1442) in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is refracted.

Figure 15:
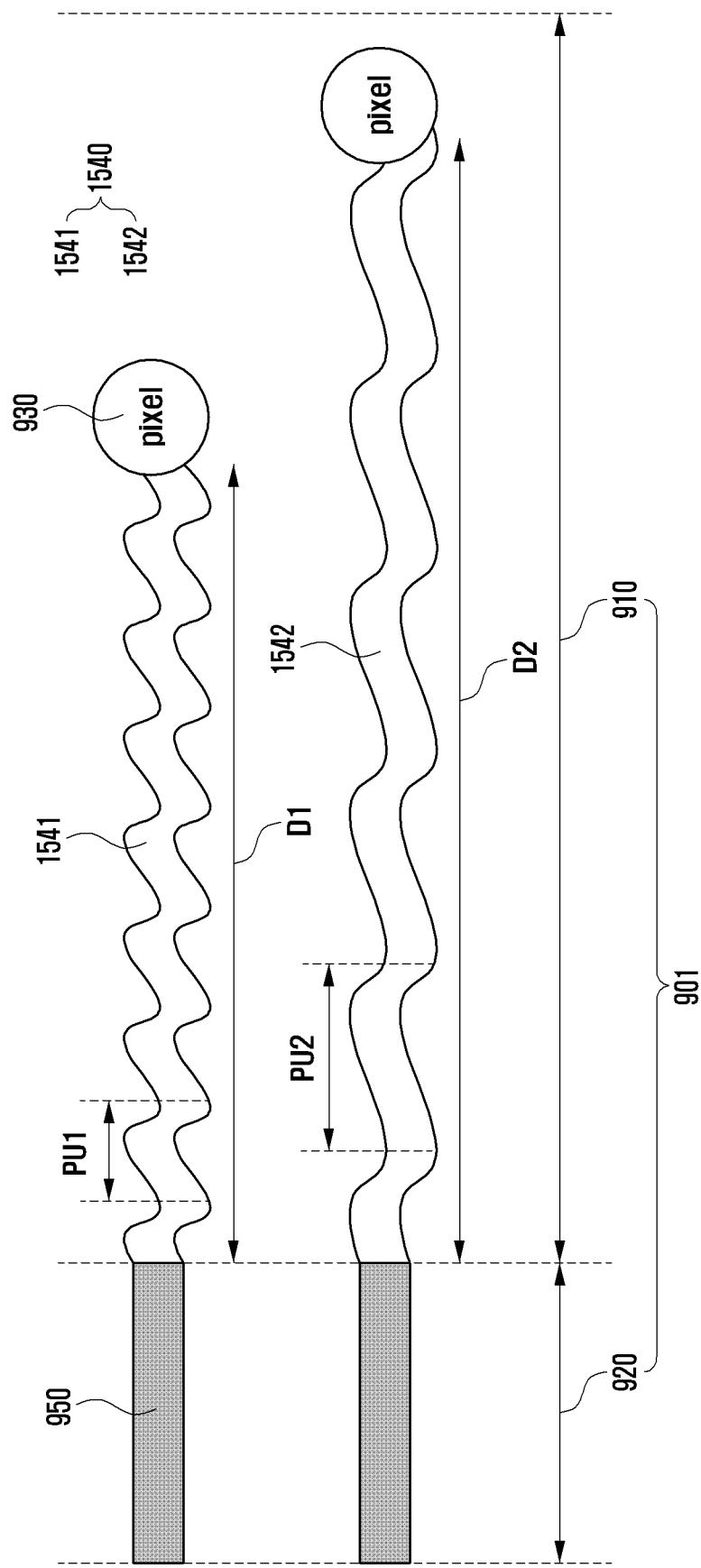
FIG. 15 is a view illustrating example connection wires according to various embodiments of the disclosure.

FIG. 15 is a view illustrating example connection wires according to various embodiments of the disclosure.

Referring to FIG. 15, connection wires 1540 may be arranged in a transmissive region (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 1540 may be electrically connected to pixels 930 arranged in the transmissive region 910. A second side of the connection wires 1140 may be electrically connected to a first side of the first metal wires 950 arranged in a non-transmissive region 920 (e.g., the non-transmissive region 720 of FIG. 7 or the non-transmissive region 720 of FIGS. 8A and 8B). A second side of the first metal wires 950 may be electrically connected to the first driving circuit (e.g., the first driving circuit 732 in FIG. 7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the connection wires 1540 may include first connection wires 1541 and second connection wires 1542 which are arranged adjacent to each other. Positions at which the first pixels 930 are arranged in the transmissive region 910 may be different from each other.

As an embodiment, the adjacent first connection wires 1541 and second connection wires 1542 may be arranged in a curved shape. As an example, the first connection wires 1541 may be provided in a form in which first pattern units PU1 having a first curvature are connected to each other. The second connection wires 1542 may be provided in a form in which second pattern units PU2 having a second curvature are connected to each other. The heights (e.g., amplitudes) of the first pattern units PU1 of the first connection wires 1541 and the second pattern units PU2 of the second connection wires 1542 may be equal to each other. The lengths (e.g., wavelengths) of the first pattern units PU1 of the first connection wires 1541 and the second pattern units PU2 of the second connection wires 1542 may be different from each other.

When the first connection wires and the second connection wires are provided in the same form, the lengths of the first connection wires and the second connection wires connected to the first pixels 930 may be different from each other. In the electronic device of the disclosure as described above, the first connection wires 1541 and the second connection wires 1542 may have substantially the same length such that the resistances of the first connection wire 1541 and the second connection wire 1542 are matched.

As an embodiment, the first connection wires 1541 connected to a pixel at a relatively short distance D1 (or length) relative to a distance D2 (or length) may be configured to have a first wavelength. The second connection wires 1542 connected to a pixel at a relatively long distance D2 greater than distance D1 may be configured to have a second wavelength longer than the first wavelength. As an example, by configuring the first connection wires 1541 and the second connection wires 1542 to have different wavelengths, the first resistance of the first connection wires 1541 and the second resistance of the second connection wires 1542 may be matched to each other to be substantially equal even when connecting to pixels at different distances from region 920.

As an example, in the electronic device according to embodiments of the disclosure, by configuring the first connection wires 1541 and the second connection wires 1542 to have different wavelengths, the first connection wires 1541 and the second connection wires 1542 may have substantially the same length even when connecting to pixels at different distances from region 920. In this way, it is possible to prevent occurrence of a difference in driving currents supplied to the pixels 930.

In an electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging curved connection wires 1540 (e.g., connection wires 1541 and 1542) in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is refracted.

Figure 16:
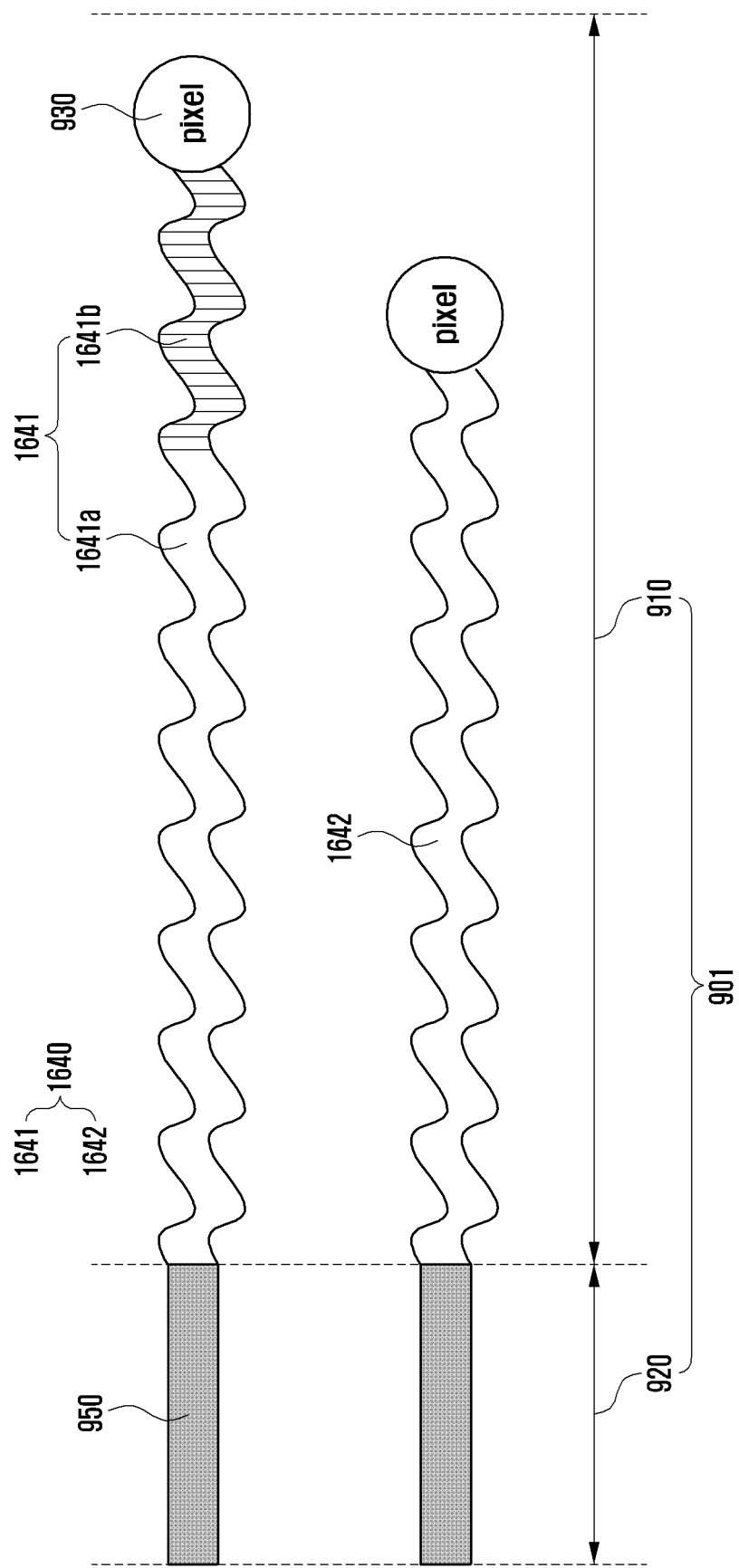
FIG. 16 is a view illustrating example connection wires according to various embodiments of the disclosure.

FIG. 16 is a view illustrating example connection wires according to various embodiments of the disclosure.

Referring to FIG. 16, connection wires 1640 may be arranged in a transmissive region 910 (e.g., the transmissive region 710 in FIG. 7 or the transmissive region 710 in FIGS. 8A and 8B) of a first region 901 (e.g., an under-display camera region) of a display panel (e.g., the display panel 520 in FIG. 5 or the display panel 700 in FIGS. 8A and 8B). A first side of the connection wires 1640 may be electrically connected to pixels 930 arranged in the transmissive region 910. A second side of the connection wires 1640 may be electrically connected to a first side of the first metal wires 950 arranged in a non-transmissive region 920 (e.g., the non-transmissive region 720 of FIG. 7 or the non-transmissive region 720 of FIGS. 8A and 8B). A second side of the first metal wires 950 may be electrically connected to the first driving circuit (e.g., the first driving circuit 732 in FIG. 7 or the first driving circuit 732 in FIGS. 8A and 8B) arranged in the non-transmissive region 920 (e.g., the non-transmissive region 720 in FIG. 7 or the non-transmissive region 720 in FIGS. 8A and 8B).

As an embodiment, the connection wires 1640 may include first connection wires 1641 and second connection wires 1642 which are arranged adjacent to each other. Since the positions at which the first pixels 930 are arranged in the transmissive region 910 are different from each other, the first length of the first connection wires 1641 connected to respective first pixels 930 and the second length of the second connection wires 1642 connected to respective first pixels 930 may be different from each other.

Since the first length of the first connection wires 1641 and the second length of the second connection wires 1642 are different from each other, the first resistance of the first connection wires 1641 and the second resistance of the second connection wires 1642 may be different from each other. When the first resistance of the first connection wires 1641 and the second resistance of the second connection wires 1642 are different from each other, a difference occurs in the driving current supplied to the pixels 930. As a result, a difference in emission luminance may occur between the pixels 930.

As an example, in the electronic device according to the embodiments of the disclosure, in order to prevent occurrence of a difference in the driving currents supplied to the pixels 930, the first connection wires 1641 (relatively longer than the second connection wires 1642) may include a first metal (e.g., transparent metal) region 1641a having a first resistance value and a second metal (e.g., transparent metal or opaque metal) region 1641b having a second resistance value lower than the first resistance value. The second connection wires 1642 may have a smaller length than the first connection wires 1641, and may having a third resistance value. The second connection wires 1642 may be formed of a third metal material. The resistance values of the first connection wires 1641 and the second connection wires 1642 may be matched to each other to be substantially the same. In this way, the first connection wires 1641 and the second connection wires 1642 having different lengths may be matched to each other to have substantially the same resistance.

In an electronic device (e.g., the electronic device 101 in FIG. 1, the electronic device 200 in FIG. 2A, the electronic device 300 in FIG. 3A, or the electronic device 500 of FIG. 5) according to embodiments of the disclosure, it is possible to suppress light spreading and flare by arranging curved connection wires 1640 (e.g., connection wires 1641 and 1642) in the transmissive region 910 (e.g., the transmissive region 710 in FIG. 7 or the transmissive region 710 in FIGS. 8A and 8B) of the first region 901 (e.g., an under-display camera region) of the display panel 700 to disperse the angle at which light is dispersed.

FIG. 17 is a view illustrating example contact portions according to the lengths of connection wires arranged in a transmissive region of a first region of a display (e.g., an under-display camera region).

Referring to FIG. 17, the first connection wires 1741 having a first length may be electrically connected to the first pixels 1731 via a first contact portion 1750. The second connection wires 1742 having a second length smaller than the first length may be electrically connected to the second pixels 1732 via a second contact portion 1760.

As an embodiment, the first connection wires 1741 having the first length are longer than the second connection wires 1742 having the second length, so that the first connection wires 1741 and the second connection wires 1742 may have different resistance values. In the electronic device according to various embodiments of the disclosure, the first contact portion 1750 connected to the first connection wires 1741 and the second contact portion 1760 connected to the second connection wires 1742 may be configured differently such that the first connection wires 1741 and the second connection wires 1742 having different lengths have substantially the same resistance value.

As an embodiment, the first contact portion 1750 connected to the first connection wires 1741 having the first length may be configured to include a plurality of contact holes, so that the contact area with the first connection wires 1741 is increased. When the contact area between the first connection wires 1741 and the first contact portion 1750 is increased, the substantial resistance value of the first connection wires 1741 may be reduced. The second contact portion 1760 connected to the second connection wires 1742 shorter than the first length may include a smaller number of contact holes than the first contact portion 1750. When the contact area between the second connection wires 1742 and the second contact portion 1760 is reduced, the substantial resistance value of the second connection wires 1742 may be increased. Through this, the actual resistance values of the first connection wires 1741 and the second connection wires 1742 may be matched to each other to be the same.

Figure 18:
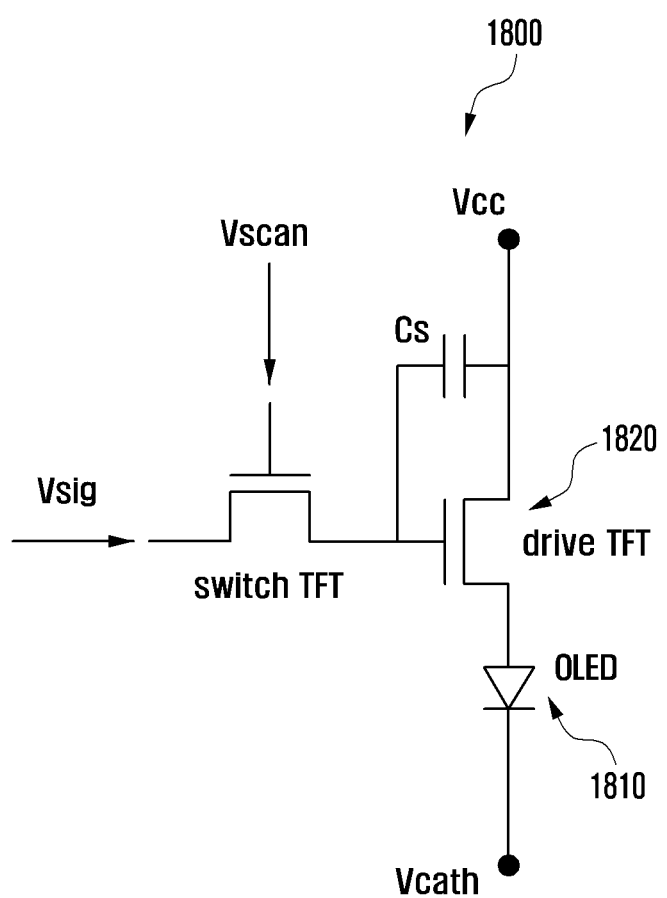
FIG. 18 is a view illustrating how to adjust a driving current of a driving transistor according to the lengths of example connection wires arranged in a transmissive region of a first region of a display (e.g., an under-display camera region).

FIG. 18 is a view illustrating how to adjust a driving current of a driving transistor according to the length of an example connection wire arranged in a transmissive region of a first region of a display (e.g., an under-display camera region).

Referring to FIG. 18, when the lengths of the first connection wires (e.g., the first connection wires 1741 in FIG. 17) and the second connection wires (e.g., the second connection wires 1742 in FIG. 17) are different from each other, the OLEDs of the pixels may be different from each other in emission luminance due to the difference in resistance value.

As an embodiment, the channel of the driving transistor 1820 of a first pixel 1800 connected to the first connection wires (e.g., the first connection wires 1741 in FIG. 17) relatively longer than the second connection wires (e.g., the second connection wires 1742 in FIG. 17) may be configured to have a first area (e.g., the length and the width of the channel). The channel of the driving transistor of a second pixel connected to the second connection wires (e.g., the second connection wires 1742 in FIG. 17) having a relatively shorter length than the first connection wires (e.g., the first connection wires 1741 in FIG. 17) may be configured to have a second area (e.g., the length and the width of the channel) smaller than the first area. In this way, when the first and second connection wires have different lengths, by configuring the channel of the first driving transistor 1820 connected to the first connection wires (e.g., the first connection wires 1741 in FIG. 17) and the channel of the second driving transistor (e.g., the second connection wires 1742 in FIG. 17) to have different areas, it is possible to make the driving current supplied to the OLED of the first pixel 1800 and the driving current supplied to the OLED of the second pixel substantially equal to each other.

According to another embodiment, the driving current supplied to each pixel may be adjusted by mapping drive data values in which the driving current supplied to each pixel is set to a lookup table.

As an example, the driving transistor 1820 of the first pixel 1800 connected to the first connection wires (e.g., the first connection wires 1741 in FIG. 17) relatively longer than the second connection wires (e.g., the second connection wires 1742 in FIG. 17) may be supplied with a first driving current according to a first data value. As an example, the driving transistor of the second pixel connected to the second connection wires (e.g., the second connection wires 1742 in FIG. 17) relatively shorter than the first connection wires (e.g., the first connection wires 1741 in FIG. 17) may be supplied with a second driving current according to a second data value. Here, the second data value may be set to be smaller than the first data value, so that the second driving current smaller than the first driving current may be supplied to the driving transistor of the second pixel. Through this, it is possible to improve the occurrence of a luminance deviation between the OLED 1810 of the first pixel 1800 and the OLED of the second pixel due to a difference in length (or a difference in resistance values) of the connection wires.

As an embodiment, data voltages and/or gamma voltages (gamma correction) supplied to the first pixel 1800 (e.g., the first pixel 1731 in FIG. 17) connected to the first connection wires (e.g., the first connection wires 1741 in FIG. 17) and the second pixel (e.g., the second pixel 1732 in FIG. 17) connected to the second connection wires (e.g., the second connection wires 1742 in FIG. 17) may be set to be different from each other. By making the data voltages and/or voltages (gamma correction) supplied to the pixels 1731 and 1732 different in consideration of the difference in the length of the connection wires (or the difference in resistance value), it is possible to suppress the occurrence of luminance deviation between OLEDs.

An electronic device (e.g., the electronic device 200 in FIG. 2, the electronic device 300 in FIG. 3, the electronic device 400 in FIG. 4, or the electronic device 500 in FIG. 5) according to various embodiments of the disclosure may include a display panel (e.g., the display panel 520 in FIG. 5 or the display panel 700 in FIGS. 8A and 8B), and a camera module (e.g., the camera module 510 in FIG. 5) disposed under the display panel 520 or 700. The display panel 520 or 700 may include a first region (e.g., the first region 601 in FIG. 6) having a first pixel density and overlapping the camera module 510, and a second region (e.g., the second region 602 in FIG. 6) having a second pixel density higher than the first pixel density. The first region 601 may include a transmissive region (e.g., the transmissive region 710 in FIG. 7) through which light is transmitted and which includes first pixels (e.g., the first pixels 612 in FIG. 6), and a non-transmissive region (e.g., the non-transmissive region 720 in FIG. 7) which is disposed around the transmissive region 710 and in which a first driving circuit (e.g., the first driving circuit 732 in FIG. 7) for driving the first pixels 612 is arranged. In the transmissive region 710, connection wires interconnecting the first pixels 612 and the first driving circuit 732 (e.g., the connection wires 740 in FIG. 7 or the connection wires 740 in FIGS. 8A and 8B) may be arranged, and the connection wires 740 may include at least one curved region (e.g., the curved region 1042 in FIG. 10).

According to an embodiment, the connection wires 740 may include adjacent first connection wires 1141 and second connection wires 1142. The adjacent first and second connection wires 1141 and 1142 may be arranged with the same interval therebetween.

According to an embodiment, the connection wires 740 may include adjacent first connection wires 1141 and second connection wires 1142. The adjacent first and second connection wires 1141 and 1142 may be arranged with different intervals therebetween.

According to an embodiment, the connection wires 740 may be provided in a form in which pattern units (e.g., the first pattern units PU1 of FIG. 10, and the second pattern units PU2 of FIG. 10) having a predetermined curvature are connected to each other.

According to an embodiment, the pattern units PU1 and PU2 may have the same amplitude.

According to an embodiment, the pattern units PU1 and PU2 may have the same length.

According to an embodiment, the pattern units PU1 and PU2 may have different amplitudes.

According to an embodiment, the pattern units PU1 and PU2 may have different lengths.

According to an embodiment, the connection wires 740 may include at least one linear region.

According to an embodiment, the connection wires 740 include adjacent first connection wires (e.g., the first connection wires 1141 in FIG. 11) and second connection wires (e.g., the second connection wires 1142 in FIG. 11). The first connection wires 1141 may be provided in a form in which the first pattern units PU1 having a first curvature are connected to each other. The second connection wires 1142 may be provided in a form in which second pattern units PU2 having a second curvature different from the first curvature are connected to each other.

According to an embodiment, the first pattern units PU1 of the first connection wires 1141 may have a first length. The second pattern units PU2 of the second connection wires 1142 may have a second length greater than the first length.

According to an embodiment, the first pattern units PU1 of the first connection wires 1141 may have a first amplitude. The second pattern units PU2 of the second connection wires 1142 may have a second amplitude greater than the first amplitude.

According to an embodiment, each of the connection wires 740 may be provided in a form in which the first pattern units PU1 having a first length and the second pattern units PU2 having a second length different from the first length are connected to each other.

According to an embodiment, the connection wires 740 may include adjacent first connection wires 1141 and second connection wires 1142. The first connection wires 1141 may have a first line width. The second connection wires 1142 may have a second line width different from the first line width.

According to an embodiment, the first connection wires may have a first length, and the second connection wire may have a second length smaller than the first length. The second line width may be greater than the first line width.

According to an embodiment, the connection wires 740 may include adjacent first connection wires 1141 and second connection wires 1142. The first connection wires 1141 may be connected to a first pixel at a first position. The second connection wires 1142 may be connected to a second pixel at a second position. The curvature of the first connection wire and the curvature of the second connection wires 1142 may be different from each other such that the first connection wires 1141 and the second connection wires 1142 have a substantially equal length.

According to an embodiment, the connection wires 740 may include adjacent first connection wires 1141 and second connection wires 1142. The first connection wires 1141 may be connected to a first pixel at a first position. The second connection wires 1142 may be connected to a second pixel at a second position. The first connection wires may include a first region 601 having a first resistance value and a second region 602 having a second resistance value smaller than the first resistance value. The second connection wire may include a third region having a third resistance value.

According to an embodiment, the first connection wire and the second connection wire may have different lengths, but may have a substantially equal resistance value.

According to an embodiment, the connection wires 740 may include adjacent first connection wires 1141 and second connection wires 1142. The first connection wires 1141 may be connected to a first pixel at a first position via a first contact portion (e.g., the first contact portion 1750 in FIG. 17). The second connection wires 1142 may be connected to a second pixel at a second position via a second contact portion (e.g., the second contact portion 1760 in FIG. 17).

According to an embodiment, the first contact portion 1750 may include a plurality of contact holes and may be connected to the first connection wires with a first contact area. The second contact portion 1760 may include a smaller number of second contact holes than the first contact portion 1750 and may be connected to the second connection wires with a second contact area smaller than the first contact area.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a display panel; and
   a camera module comprising a camera disposed under the display panel,
   wherein the display panel includes:
   a first region having a first pixel density and overlapping the camera module, the first region including a transmissive region through which light is transmitted and which includes first pixels, and a non-transmissive region which is disposed around the transmissive region and in which a first driving circuit configured to drive the first pixels is arranged;
   a second region having a second pixel density greater than the first pixel density; and
   connection wires arranged in the transmissive region and connecting the first pixels and the first driving circuit to each other, wherein
   the connection wires include a first connection wire and an adjacent second connection wire,
   the first connection wire comprises first pattern units connected to each other, each first pattern unit comprising a curved region of the first connection wire having a first curvature and a first amplitude, and the second connection wire comprises second pattern units connected to each other, each second pattern unit comprising a curved region of the second connection wire having a second curvature different from the first curvature and a second amplitude greater than the first amplitude.

2. The electronic device of claim 1, wherein the connection wires are arranged with an equal interval therebetween.

3. The electronic device of claim 1, wherein the connection wires are arranged with different intervals therebetween.

4. The electronic device of claim 1, wherein lengths of the first pattern units and the second pattern units are equal.

5. The electronic device of claim 1, wherein lengths of the first pattern units and the second pattern units are different.

6. The electronic device of claim 5, wherein the first pattern units of the first connection wire have a first length, and
the second pattern units of the second connection wire have a second length greater than the first length.

7. The electronic device of claim 1, wherein at least one of the connection wires includes at least one linear region.

8. The electronic device of claim 1, wherein
the first connection wire has a first wire width, and
the second connection wire has a second wire width different from the first wire width.

9. The electronic device of claim 8, wherein the first connection wire has a first length, the second connection wires has a second length less than the first length, and the first wire width is greater than the second wire width.

10. The electronic device of claim 1, wherein
the first connection wire is connected to a first pixel of the first pixels at a first position,
the second connection wire is a second pixel of the first pixels at a second position, and
the first connection wire and the second connection wire have a substantially equal length.

11. The electronic device of claim 1, wherein
the first connection wire is connected to a first pixel of the first pixels at a first position,
the second connection wire is connected to a second pixel of the first pixels at a second position,
the first connection wire includes a first region having a first resistance value and a second region having a second resistance value smaller than the first resistance value, and
the second connection wire includes a third region having a third resistance value.

12. The electronic device of claim 11, wherein the first connection wire and the second connection wire have different lengths, but have a substantially equal resistance value.

13. The electronic device of claim 1, wherein
the first connection wire is connected to a first pixel at a first position via a first contact portion, and
the second connection wire is connected to a second pixel at a second position via a second contact portion.

14. The electronic device of claim 13, wherein the first contact portion includes a plurality of contact holes including a first contact hole connected to the first connection wire with a first contact area, and
the second contact portion includes a smaller number of contact holes than the first contact portion and includes a second contact hole connected to the second connection wire with a second contact area smaller than the first contact area.

15. An electronic device comprising:
a display panel; and
a camera module comprising a camera disposed under the display panel,
wherein the display panel includes:
a first region having a first pixel density and overlapping the camera module, the first region including a transmissive region through which light is transmitted and which includes first pixels, and a non-transmissive region which is disposed around the transmissive region and in which a first driving circuit configured to drive the first pixels is arranged;
a second region having a second pixel density greater than the first pixel density; and
connection wires arranged in the transmissive region and connecting the first pixels and the first driving circuit to each other, the connection wires include at least one curved region, wherein
the connection wires include adjacent first connection wires and second connection wires,
the first connection wires have a first wire width,
the second connection wires have a second wire width different from the first wire width,
the first connection wires a first length,
the second connection wires have a second length less than the first length, and
the second wire width is greater than the first wire width.

16. An electronic device comprising:
a display panel; and
a camera module comprising a camera disposed under the display panel,
wherein the display panel includes:
a first region having a first pixel density and overlapping the camera module, the first region including a transmissive region through which light is transmitted and which includes first pixels, and a non-transmissive region which is disposed around the transmissive region and in which a first driving circuit configured to drive the first pixels is arranged;
a second region having a second pixel density greater than the first pixel density; and
connection wires arranged in the transmissive region and connecting the first pixels and the first driving circuit to each other, the connection wires include at least one curved region, wherein
the connection wires include adjacent first connection wires and second connection wires,
the first connection wires include a first connection wire connected to a first pixel of the first pixels at a first position,
the second connection wires include a second connection wire connected to a second pixel of the first pixels at a second position,
the first connection wire includes a first region having a first resistance value and a second region having a second resistance value smaller than the first resistance value, and the second connection wire includes a third region having a third resistance value.

* * * * *